United States Patent [19]

Takahashi et al.

[11] Patent Number: 5,574,292
[45] Date of Patent: Nov. 12, 1996

[54] SEMICONDUCTOR DEVICE WITH MONOSILICON LAYER

[75] Inventors: Kunihiro Takahashi; Yoshikazu Kojima; Hiroaki Takasu; Tsuneo Yamazaki; Tadao Iwaki, all of Tokyo, Japan

[73] Assignee: Seiko Instruments Inc., Japan

[21] Appl. No.: 57,986

[22] Filed: May 5, 1993

[30] Foreign Application Priority Data

May 13, 1992 [JP] Japan .................................. 4-120699
Aug. 19, 1992 [JP] Japan .................................. 4-220503

[51] Int. Cl.⁶ ...................................................... H01L 33/00
[52] U.S. Cl. ............................. 257/59; 257/88; 257/103; 257/93; 359/59; 359/58; 359/82
[58] Field of Search ............................. 257/103, 59, 351, 257/350, 88, 98, 95, 67, 89, 62, 82, 93; 359/59, 58, 82, 72, 89

[56] References Cited

U.S. PATENT DOCUMENTS

| | | | |
|---|---|---|---|
| 4,024,626 | 5/1977 | Leupp et al. | 29/571 |
| 4,199,773 | 4/1980 | Goodman et al. | 357/23 |
| 4,395,726 | 7/1983 | Maeguchi | 257/351 |
| 4,776,673 | 10/1988 | Aoki et al. | 257/350 X |
| 5,132,820 | 7/1992 | Someya et al. | 359/59 |
| 5,191,453 | 3/1993 | Okumura | 257/59 X |

FOREIGN PATENT DOCUMENTS

| | | |
|---|---|---|
| 0164646 | 12/1985 | European Pat. Off. . |
| 0182371 | 5/1986 | European Pat. Off. . |
| 0211402 | 2/1987 | European Pat. Off. . |
| 0268380 | 5/1988 | European Pat. Off. . |
| 0304811 | 3/1989 | European Pat. Off. . |
| 0342925 | 11/1989 | European Pat. Off. . |
| 0474474 | 3/1992 | European Pat. Off. . |
| 2715446 | 10/1978 | Germany . |
| 134283 | 2/1979 | Germany . |
| 57-167655 | 10/1982 | Japan . |
| 59-126639 | 7/1984 | Japan . |
| 60-143666 | 7/1985 | Japan . |
| 60-167364 | 8/1985 | Japan . |
| 61-232661 | 10/1986 | Japan . |
| 63-090859 | 4/1988 | Japan . |
| 63-101831 | 5/1988 | Japan . |
| 1-038727 | 2/1989 | Japan . |
| 1-241862 | 9/1989 | Japan . |
| 3-100516 | 4/1991 | Japan . |
| 3-242622 | 10/1991 | Japan . |
| 4-034979 | 2/1992 | Japan . |
| 2206445 | 1/1989 | United Kingdom . |
| 8808202 | 10/1988 | WIPO . |

OTHER PUBLICATIONS

Patent Abstracts of Japan, vol. 12, No. 328 (E–654) Sep. 6, 1988.

Patent Abstracts of Japan, vol. 16, No. 32 (P–1303) Jan. 27, 1992.

Patent Abstracts of Japan, vol. 11, No. 77 (E–487) (2524) Mar. 7, 1987.

(List continued on next page.)

Primary Examiner—William Mintel
Attorney, Agent, or Firm—Adams & Wilks

[57] ABSTRACT

A semiconductor device has an integrated circuit formed in a monosilicon layer provided on an electrically insulative material. The monosilicon layer has an integrated circuit formed thereon, and a passivation film covers the integrated circuit. A support member is fixed to the electrically insulative material through an adhesive layer to support the monosilicon layer. The integrated circuit comprises an MIS transistor having a source region, drain region, and channel region formed in the monosilicon layer. The semiconductor device is suitable for use in a high speed, high capacity liquid crystal light valve having a structure where a pixel switching element group and a peripheral driver circuit are formed integrally on a common substrate.

26 Claims, 17 Drawing Sheets

OTHER PUBLICATIONS

Patent Abstracts of Japan, vol. 8, No. 250 (E–279) Nov. 16, 1984.

Patent Abstracts of Japan, vol. 16, No. 210 (E–1203) May 19, 1992.

Patent Abstracts of Japan, vol. 12, No. 341 (P–758) Sep. 13, 1988.

Patent Abstracts of Japan, vol. 10, No. 1 (E–371) (2058) Jan. 7, 1986.

IEEE Transactions on Electron Devices, vol. 37, No. 1, Jan. 1990, pp. 121–127.

Japanese Journal of Applied Physics, vol. 29, No. 4, part 2, Apr. 1990, pp. L521–L523.

Fujitsu Scientific and Technical Journal, vol. 24, No. 4 & index, Dec. 1988, pp. 408–417.

Journal of the Electromechanical Society, vol. 120, No. 11, Nov. 1973, pp. 1563–1566.

Patent Abstracts of Japan, vol. 13, No. 228 (P–877) 26 May 1989.

Patent Abstracts of Japan, vol. 13, No. 578 (E–864) 20 Dec. 1989.

Patent Abstracts of Japan, vol. 10, No. 298 (P–505) 9 Oct. 1986.

Patent Abstracts of Japan, vol. 10, No. 1, (E–371) 7 Feb. 1986.

Patent Abstracts of Japan, vol. 13, No. 572, (P–978) 18 Dec. 1989.

Patent Abstracts of Japan, vol. 15, No. 287 (P–1229) 22 Jul. 1991.

FIG. 3
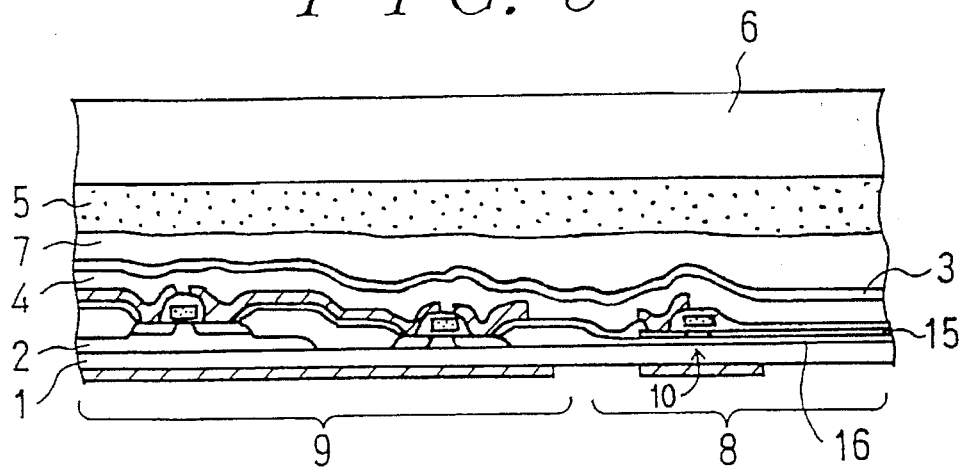
FIG. 4 (A-1)
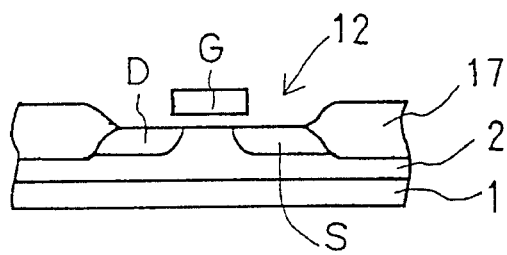
FIG. 4 (A-2)
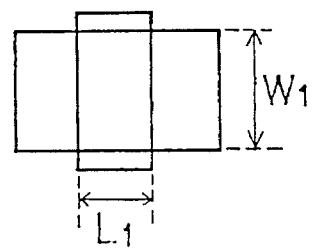
FIG. 4 (B-1)
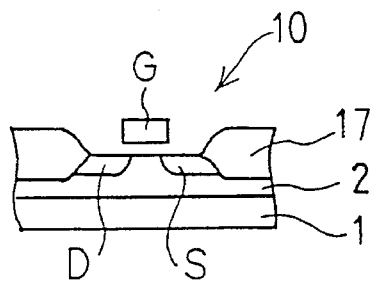
FIG. 4 (B-2)
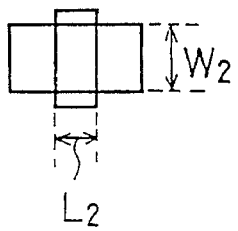

peripheral driver circuit area | picture area (A)

(B)

(C)

SEMICONDUCTOR DEVICE WITH MONOSILICON LAYER

BACKGROUND OF THE INVENTION

The present invention relates to a semiconductor device. Particularly, the invention relates to a semiconductor drive substrate used for a light valve such as an active matrix liquid crystal display. More specifically, the invention relates to a structure where a pixel switching element group and a peripheral driver circuit are formed integrally on a common substrate.

Conventionally, there has been known a so-called TFT substrate in which thin film transistors (TFT) are integrally formed on an insulating substrate such as quartz so as to constitute a drive substrate of an active matrix light valve. For example, Japanese Patent Laid-open No. 3-101714 discloses a TFT substrate utilizing a polysilicon as a semiconductor thin film material. Further, there has been known another TFT substrate utilizing an amorphous silicon in place of the polysilicon. However, the polysilicon and amorphous silicon have a relatively small carrier mobility, hence it is difficult to form a peripheral drive circuit on the same substrate.

Recently, another technology has been developed and is disclosed in, for example, Japanese Patent Laid-open No. 3-100516 where a single crystal silicon or monosilicon layer is laminated on an insulating substrate such as quartz to form the drive substrate. In contrast to the polysilicon and amorphous silicon, the monosilicon has a relatively great mobility, and therefore has an advantage in that a peripheral drive circuit of high performance and large capacity may be formed concurrently by utilizing regular IC fabrication process. However, a process temperature of the IC fabrication reaches up to 1150° C., causing pending deformation of a wafer due to a difference of thermal expansion coefficients between the monosilicon layer and the insulating substrate, resulting in a drawback in that a desired yield rate cannot be obtained.

Another technology has been recently developed in which a drive substrate of the light valve is formed of a bulk monosilicon wafer, as disclosed, for example, in 8th International Workshop on Future Electronic Devices, Mar. 14–16, 1990, pages 81–84, Kouch-Ken, Japan. The regular LSI fabrication process can be applied to the bulk monosilicon wafer without a problem. However, the wafer must be transformed into a transparent substrate for use in the light valve. An integrated circuit formed in the wafer is subjected to device transfer process twice, so as to replace the silicon wafer by a transparent substrate, thereby disadvantageously complicating fabricating steps.

In order to reduce the number of steps of the device transfer process in changing the bulk monosilicon wafer to become transparent, a prior art method utilizing epitaxial technology is disclosed, for example, in Japanese Patent Laid-open Nos. 63-90859 and 63-101831. In this prior art method, an insulating layer is formed on a surface of a single crystal silicon wafer, and thereafter a window is selectively opened to form therein an epitaxial monosilicon region. A transistor device is formed in this epitaxial region, and then the transistor device is transferred to a transparent substrate to thereby replace the silicon wafer. In the transferring process, the surface of the transistor device is coated by a protective film composed of silicon dioxide by CVD, and further the transparent substrate is laminated using an adhesive. Then, a bulk portion of the silicon wafer is removed while utilizing the above mentioned insulating film as an etching stopper.

In the last mentioned fourth prior art method, the regular IC fabrication process is applicable since the monosilicon wafer is utilized, and further advantageously a single device transfer process is needed. However, when transferring the integrated transistor device, the silicon wafer and the transparent substrate or a support member are laminated with each other by the adhesive. The adhesive normally contains contaminants such as alkali metal, hence the device surface is provisionally applied with a protective film or a passivation film. As described before, the protective film is composed of a silicon dioxide film containing phosphorus (PSG film) deposited by CVD. However, the adhesive contains water vapor and hydrogen gas besides the alkali metal, which may disadvantageously degrade electrical characteristics of the device. While the PSG film can effectively block contaminants such as alkali metal, the water vapor and hydrogen gas may permeate the PSG film, therefore failing to protect the device. In view of the problems of the prior art, a first object of the present invention is to prevent degradation of the device and to improve the reliability in the substrate structure where the light valve device formed on the monocrystal semiconductor layer is transferred to the transparent support member.

Further, in the above noted fourth prior art method, the surface of the monosilicon wafer is covered by the insulating film, which is then selectively opened to provide a window to form an epitaxial region for the integrated device. However, such a process is rather complicated and requires delicate control, and is therefore not suitable for mass production. In view of this, according to the invention, a drive substrate of the active matrix light valve is formed by using a substrate having a monosilicon layer disposed on a silicon wafer through an electrically insulative material (hereinafter, such a type of substrate is referred to as "SOI substrate"). Various disadvantages and drawbacks arise when a device element such as a transistor is formed in the monosilicon layer disposed on the electrically insulative material. These drawbacks include an increase in a leak current by a parasitic channel, an unstable substrate potential level, and the generation of a photoelectric leak current. Thus, a second object of the invention is to improve electrical characteristics of a transistor formed in the SOI substrate.

SUMMARY OF THE INVENTION

The present invention overcomes the drawbacks of the prior art. An object of the present invention is to provide a semiconductor device that can be utilized as, for example, a drive substrate of an active matrix light valve. As shown in FIG. 1, the present semiconductor device has, at least, an integrated circuit formed in a single crystal silicon or monosilicon layer 2 provided on an electrically insulative material 1. The electrically insulative material 1 may be composed of, for example, a silicon dioxide layer. The present semiconductor device is produced by using an SOI substrate in which the monosilicon layer 2 is provided on a monosilicon wafer through the electrically insulative material 1 or dielectric material composed of silicon dioxide film. In the completed state shown in the figure, the monosilicon wafer is removed. The dielectric material 1 composed of silicon dioxide is initially buried between the monosilicon layer 2 and the monosilicon wafer, and is therefore called "BOX".

The integrated circuit formed in the monosilicon layer 2 is covered by a passivation film having a top layer composed of a silicon oxynitride film or a silicon nitride film 3. In this embodiment, the passivation film has a double layer structure composed of the above mentioned silicon oxynitride film or silicon nitride film 3 and a silicon dioxide film 4. A transparent adhesive layer 5 is disposed on the passivation film. The monosilicon layer 2 formed on the dielectric material 1 is fixed to and supported by a transparent support member 6 through the adhesive layer 5. Stated otherwise, the integrated circuit initially formed on the SOI substrate is transferred to the support member 6 to obtain transparency. Preferably, a leveling layer 7 is interposed between the passivation film and the adhesive layer 5.

The integrated circuit formed in the monosilicon layer 2 includes a group of pixel switch elements 8 of an active matrix display, and a driver integrated circuit 9 for driving the pixel switch elements 8. Those of the pixel switch elements 8 and the driver integrated circuit 9 are composed of an MIS transistor of the electric field effect type having a metal/insulator/semiconductor structure. Particularly, a respective one of the pixel switching elements 8 is composed of a P channel type MIS transistor 10. On the other hand, the driver integrated circuit 9 is comprised of complementary MIS transistors. In this embodiment, an N channel type MIS transistor 11 is formed in a region of the monosilicon layer 2 having a relatively great thickness, while a P channel type MIS transistor 12 is formed in another region of the monosilicon layer 2 having a relatively small thickness. Further, the driver integrated circuit 9 is formed in a region of the monosilicon layer 2 having a relatively great thickness, while the group of the pixel switching elements 8 is formed in another region of the monosilicon layer 2 having a relatively small thickness.

According to the invention, the passivation film having a top layer composed of the silicon oxynitride film or silicon nitride film 3, is interposed between the monosilicon layer 2 formed with the integrated circuit, and the adhesive layer 5. The silicon oxynitride film or silicon nitride film 3 has a thickness over 100 nm, so as to prevent permeation of water vapor and hydrogen gas, thereby suppressing degradation of electrical characteristics of the transistor and improving reliability of the integrated circuit.

The leveling layer 7 is interposed between the passivation film and the adhesive layer 5. This leveling layer 7 is composed of, for example, silicon dioxide compound, which does not hinder the performance of the integrated circuit and which is chemically stable and highly reliable. The interposed leveling layer 7 is effective to improve adhesion force between the adhesive layer 5 and the passivation film. Generally, the leveling layer 7 composed of silicon dioxide has better adhesion force to the adhesive layer 5 than the silicon oxynitride film or silicon nitride film 3.

The integrated circuit formed in the monosilicon layer 2 is composed of an MIS transistor having a tiny device size which enables high integration suitable for a drive substrate of the active matrix light valve of large capacity type. Further, the use of the monosilicon layer as a device region achieves higher operation speed of the integrated circuit suitable for the active matrix light valve. The driver integrated circuit 9 is composed of complementary MIS transistors effective to reduce device area and improve integration density as well as to lower power consumption. Further, the P channel MIS transistor 10 is formed in a relatively thin region of the monosilicon layer 2, while the N channel MIS transistor 11 is formed in a relatively thick region, thereby effectively suppressing leak current. Moreover, the group of the pixel switching elements 8 is composed of the P channel type transistor 10 which has a relatively small leak current as compared to an N channel type MIS transistor.

In this invention, the integrated circuit is produced by using the SOI substrate, which can be applied with an ordinary IC fabrication process of high temperature. Further, the integrated circuit formed on the SOI substrate can be transferred to the transparent support member 6 by a single device transferring.

BRIEF DESCRIPTION OF THE DRAWINGS

FIG. 3 is a sectional diagram showing a second embodiment of the inventive semiconductor device;

FIG. 4(A-1) to FIG. 4(B-2) are schematic diagrams showing a third embodiment of the inventive semiconductor device;

DETAILED DESCRIPTION OF THE PREFERRED EMBODIMENTS

Figure 1:
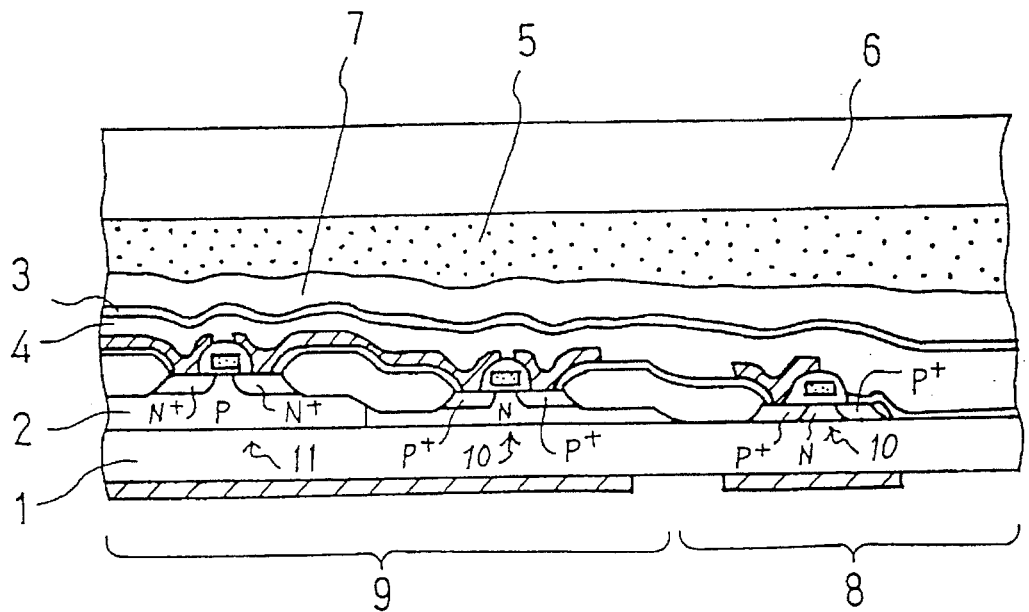
FIG. 1 is a schematic sectional diagram showing a basic construction of the inventive semiconductor device.
Figure 2:
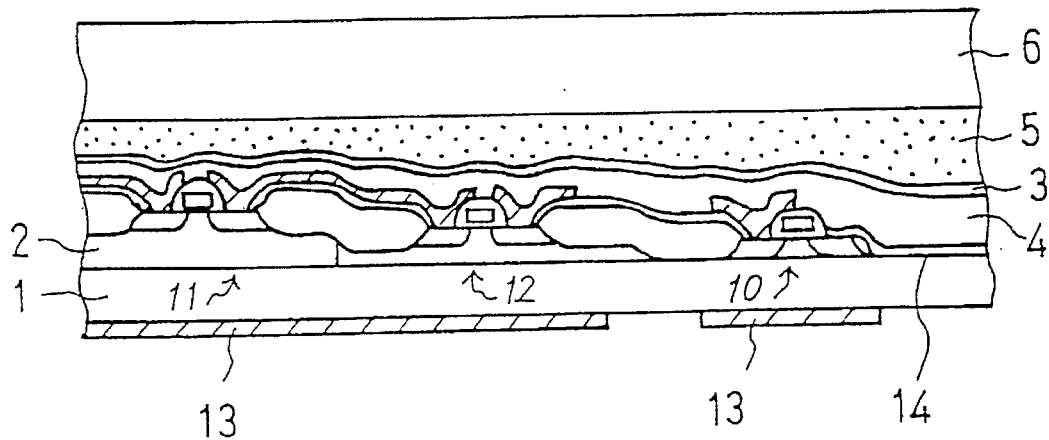
FIG. 2 is a sectional diagram showing a first embodiment of the inventive semiconductor device.

Hereinafter, preferred embodiments of the invention will be described in detail with reference to the drawings. FIG. 2 is a schematic sectional diagram showing a first embodiment of the semiconductor device according to the invention. This embodiment is similar to the basic structure of FIG. 1, and therefore a corresponding portion is denoted by the same reference numeral to facilitate the understanding. A different point than the FIG. 1 construction is that the leveling layer is eliminated. Namely, the adhesive layer 5 directly contacts with the silicon oxynitride film or silicon nitride film 3 disposed as a top layer of the passivation film. Such a construction simplifies the production steps. Though not mentioned in FIG. 1, a rear side of the dielectric material 1 is formed with a light shielding layer 13 composed of a patterned metal film, which covers selectively those of the MIS transistors 10, 11 and 12 to suppress the photoelectric leak current. Additionally, although not mentioned in FIG. 1, a pixel electrode 14 composed of a patterned polysilicon film is connected to a source region of the MIS transistor 10 which constitutes each pixel switching element 8.

FIG. 3 is a schematic sectional diagram showing a second embodiment of the inventive semiconductor device. This embodiment is similar to the FIG. 1 construction, and therefore, the same reference numeral is used for the same part to facilitate understanding. A different aspect is that the MIS transistor 10 which constitutes the pixel switching element 8 is formed in a polysilicon layer or an amorphous layer 15, rather than the monosilicon layer 2. In this embodiment, a region of the monosilicon layer 2 on the dielectric material 1 is partly transformed into an insulating film 16 such as a silicon oxide film. The polysilicon film or amorphous silicon film 15 is formed on the insulating film 16 for forming the MIS transistor 10 as the pixel switching element. Further, the polysilicon or amorphous silicon film 15 is extended to constitute a pixel electrode. In this embodiment, the group of the pixel switching elements are composed of MIS transistors. However, the invention is not limited to this embodiment, and the pixel switching elements can alternatively be composed of diodes. The polysilicon or amorphous silicon transistor has a smaller number of electron and hole pairs generated by light irradiation and has a shorter life of carriers, as compared to the monosilicon transistor, thereby being suitable for the drive substrate of the light valve. However, the driver integrated circuit 9 is composed of a monosilicon transistor in a manner similar to the FIG. 1 construction. The monosilicon transistor has a high driveability, and is therefore suitable to produce a small and fast driver integrated circuit.

FIG. 4 is a schematic diagram showing a third embodiment of the inventive semiconductor device. The part of (A-1) and (A-2) is a schematic sectional view and a plan view showing one MIS transistor taken from the driver integrated circuit. This MIS transistor 12 is formed in the monosilicon layer 2 disposed on a dielectric material, i.e., BOX 1, and is comprised of a source region S, a drain region D and a gate electrode G. The MIS transistor 12 is provided in a device region bordered by a field oxide film 17. As shown in the figure, the device region of the MIS transistor 12 has a width size $W_1$ and length size $L_1$.

On the other hand, part of (B-1) and (B-2) is a sectional view and a plan view of one MIS transistor 10 taken from the group of the pixel switching elements 8. Similarly, the MIS transistor 10 is comprised of a drain region D, a source region S and a gate electrode G. The device region surrounded by the field oxide film 17 has a width size $W_2$ and a length size $L_2$. In this embodiment, the product of $L_2$ and $W_2$ of the MIS transistor 10 which constitutes the pixel switching element 8 is set smaller than the product of $L_1$ and $W_1$ of the other MIS transistor 12 contained in the driver integrated circuit.

As described before, the monosilicon transistor has a greater photoelectric leak current as compared to the polysilicon transistor and amorphous silicon transistor. Namely, in the monosilicon transistor, the number of electron and hole pairs generated by the light irradiation is much greater, and the life of the pairs is much longer. Particularly, the pixel switching element group is frequently exposed to the light irradiation. Therefore, in order to reduce a generation area of carriers and to suppress photoelectric leak current, the size of the MIS transistor of the pixel switching element group is set smaller than that of the other MIS transistor contained in the drive integrated circuit. For the same reason, a thickness of the monosilicon layer 2 is set smaller in the device region of the MIS transistor 10, than that in the other device region of the MIS transistor 12 shown in FIGS. 4(A-1) and 4(A-2).

In order for a better understanding of the invention, a brief description will be given hereinafter for a photoelectric leak phenomenon of the monosilicon transistor with reference to FIGS. 28–30. A monosilicon layer is patterned in an island shape on BOX. An N channel MIS transistor is formed in the patterned monosilicon layer, in which a channel region Ch is provided between a source region S and a drain region D. A gate electrode G is patterned over the channel region Ch through a gate insulating film GOX. Pairs of electron and hole are generated in the channel region Ch upon irradiation of incident light. The holes are easily accumulated in the channel region Ch to draw electrons from the source region S held at a ground potential to thereby induce so-called bipolar action. On the other hand, the electrons are attracted by the drain region held at a positive potential, and are concurrently collected in a portion of a boundary between the BOX and the monosilicon layer where an energy band drops, thereby lastly drifting to the drain region D through the boundary path. A photoelectric current flows in such a manner.

Figure 28:
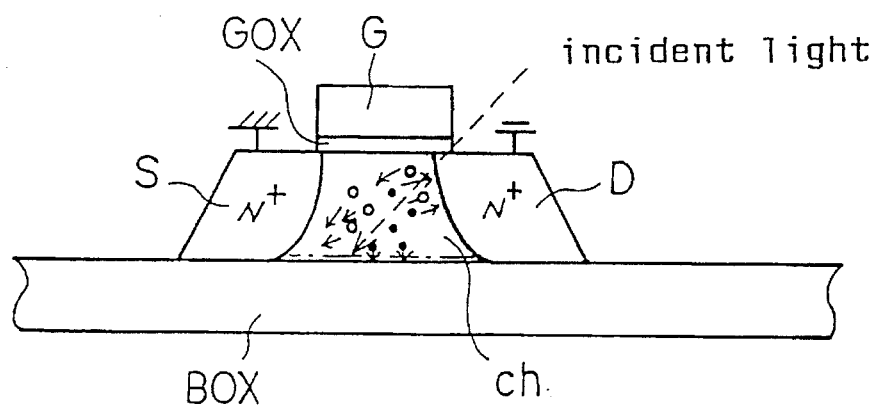
FIG. 28 is a schematic diagram illustrative of a photoelectric current generation mechanism.
Figure 29:
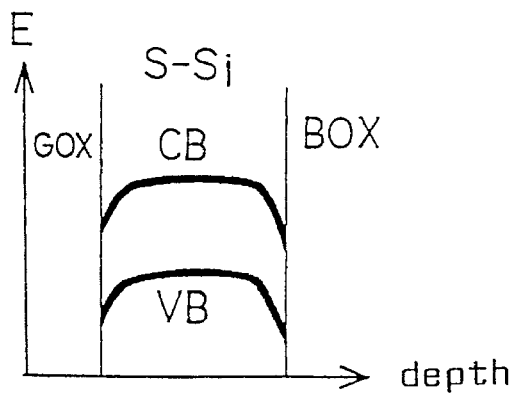
FIG. 29 is an energy band diagram of the monosilicon layer.

FIG. 29 shows a variation of an energy band in the monosilicon layer shown in FIG. 28 along the thickness direction. The conduction band CB falls at the boundary between the monosilicon layer S-Si of the channel region and the BOX to provide an energy band structure in which electrons tend to be stored. For this, the leak current tends to flow through the boundary between S-Si and BOX, particularly in the N channel transistor. Further, an energy band of the valence band VB also falls at the boundary between S-Si and BOX. For this, the holes are not collected in this boundary area.

Figure 30:
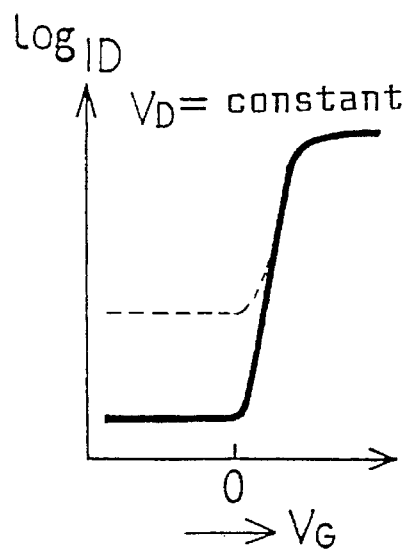
FIG. 30 is a graph showing the relation between a gate voltage and a drain current in the MIS transistor.

FIG. 30 is a graph showing the relation between a gate voltage $V_G$ and a drain current $I_D$ of the monosilicon transistor. The measurement is carried out at a constant drain voltage $V_D$. The dot curve indicates a characteristic under light irradiation, and the solid curve indicates another characteristic under light shield. As seen from the graph, the leak current increases under the light irradiation, thereby hindering ON/OFF characteristic of the monosilicon transistor.

Figure 25A:
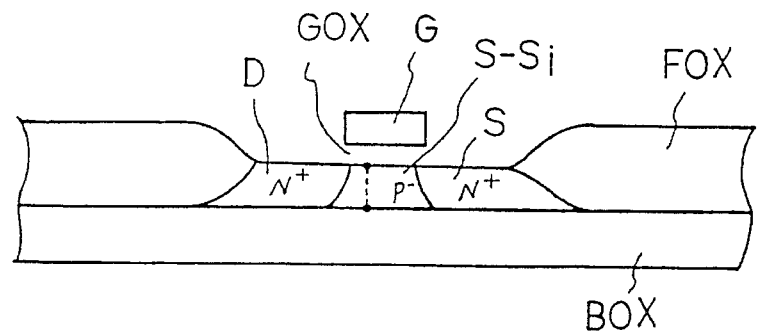
FIG. 25(A) and FIG. 25(B) are schematic diagrams illustrative of a parasitic channel generating mechanism.

The monosilicon MIS transistor of the thin film type formed on the dielectric material suffers from another problem in that a leak current increases through a so-called parasitic channel, besides the photoelectric leak current. Hereinafter, the parasitic channel will be discussed in conjunction with FIGS. 25-27, before proceeding to a description of several embodiments directed to suppression of the parasitic channel, for better understanding. FIG. 25(A) shows a general structure of the N channel MIS transistor formed in the SOI substrate. A monosilicon layer S-Si is surrounded by a field oxide film FOX to provide a device region on a BOX. The device region is formed with a pair of source and drain regions S, D of $N^+$ type, and a channel region is provided therebetween. A gate electrode G is patterned over the channel region through a gate insulating film GOX. An impurity region of $P^-$ type is provided in the monosilicon layer S-Si just under the gate electrode G.

Figure 25B:
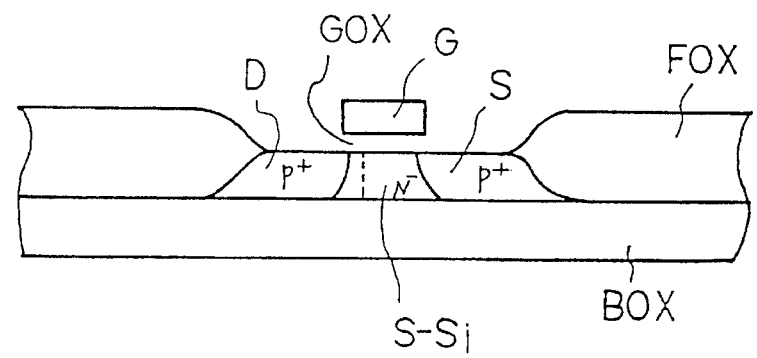

FIG. 25(B) shows a P channel MIS transistor formed on the same SOI substrate. In the P channel structure, the drain region D and the source region S are composed of a $P^+$ type impurity region, and an $N^-$ type impurity region is provided in the monosilicon layer S-Si just under the gate electrode G.

Figure 26:
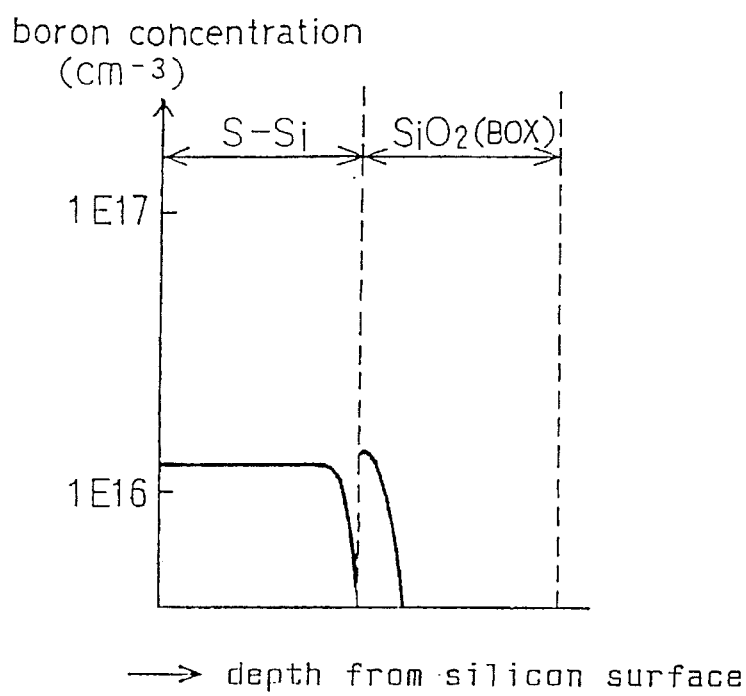
FIG. 26 is a graph showing a profile of a boron impurity in the vicinity of a boundary between a monosilicon layer and a dielectric material layer.

FIG. 26 shows a depth profile of a density of the $P^-$ type impurity region of the N channel type MIS transistor shown in FIG. 25(A). In this case, boron is doped as a P type impurity. As seen from this profile, the boron density is abruptly reduced in the monosilicon layer S-Si around the boundary between the monosilicon layer S-Si and BOX due to segregation of the boron. Therefore, the boron density is very thin in the boundary region, thereby providing a current path of the N channel MIS transistor. Consequently, a parasitic channel is easily formed to increase a leak current.

Figure 27:
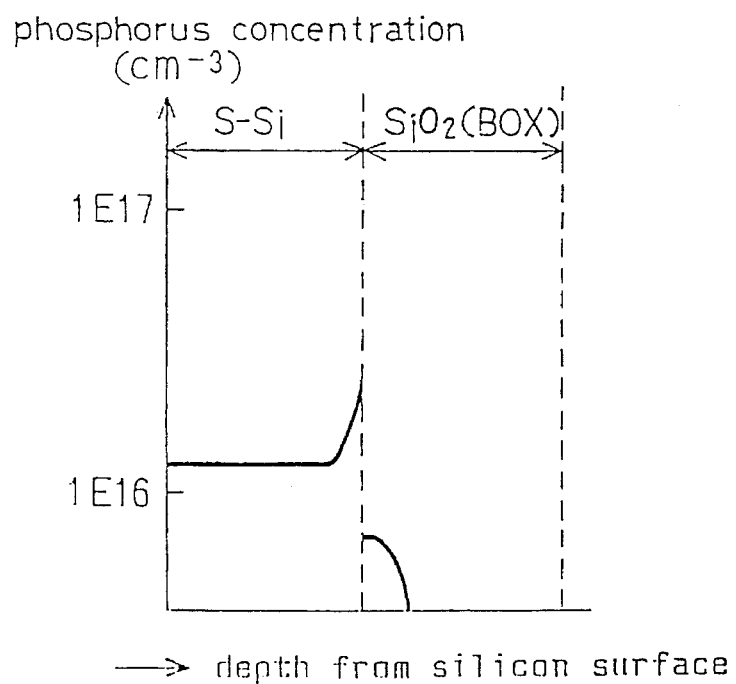
FIG. 27 is a graph showing a profile of a phosphorus impurity in the vicinity of a boundary between the monosilicon layer and the dielectric material layer.

On the other hand, FIG. 27 shows a depth profile of a density in the $N^-$ type impurity region of the P channel MIS transistor shown in FIG. 25(B). In this case, phosphorus is doped as an N type impurity. As seen from this profile, the phosphorus density is increased in the monosilicon layer S-Si around the boundary between the monosilicon layer S-Si and BOX due to segregation of phosphorus. Therefore, an electric path is hardly formed in the boundary region because of a relatively high density of the doped phosphorus. Consequently, the P channel MIS transistor is structurally very free from a parasitic channel as compared to the N channel MIS transistor.

Similar to an ordinary MIS transistor formed in a wafer composed of a bulk monosilicon, the MIS transistor formed in the SOI substrate is subjected to a channel doping process for threshold control. For example, in the N channel transistor, a P type impurity such as boron having the same conductivity type as the monosilicon layer is doped, by ion implantation, into a surface portion of the monosilicon layer having a relatively low impurity density less than $1 \times 10^{16} cm^{-3}$. By channel doping of the P type impurity, the monosilicon layer has a relatively high impurity density of the P type in the surface portion and a relatively low impurity distribution in the internal portion. Therefore, in the N channel MIS transistor formed in the SOI substrate, the P type impurity density is lowered in the vicinity of the boundary to BOX or buried oxide film, as compared to the surface portion. Further, the use of boron as an impurity may cause segregation at the boundary between the monosilicon layer and BOX as mentioned before, so that the impurity density is further reduced in the monosilicon layer. Not only the N channel transistor, but also the P channel transistor contains an electric field in the boundary between the monosilicon layer and BOX so as to form a depletion region and inversion region around the boundary. Consequently, a parasitic channel is induced in a region of the monosilicon layer adjacent to the BOX. This region has a threshold value smaller than that of the normal channel region.

Several embodiments will be described hereinafter in detail with reference to FIGS. 5–20, directed to suppression of the parasitic channel. First, in an embodiment shown in FIG. 5, an N channel MIS transistor is formed on an SOI substrate in an island shape. The SOI substrate has a laminate structure in which a monosilicon layer S-Si is laminated on a substrate SUB composed of silicon through a BOX. This monosilicon layer S-Si is patterned in the island shape as described above to define a device region. The N channel MIS transistor includes a $P^{+-}$ region R composed of the monosilicon layer S-Si which contains a P type impurity, a pair of $N^+$ source and drain regions S, D formed in the monosilicon layer S-Si doped with a P type impurity, and a channel region Ch formed over the region R between the source and drain regions S, D. A gate electrode G is patterned over the channel region Ch through a gate insulating film GOX. The P type impurity is doped into the region R adjacent to BOX, at a sufficient density to prevent generation of a parasitic channel between the source and drain regions S, D. In addition, an N type impurity is doped into the channel region Ch for controlling a threshold voltage.

Figure 5:
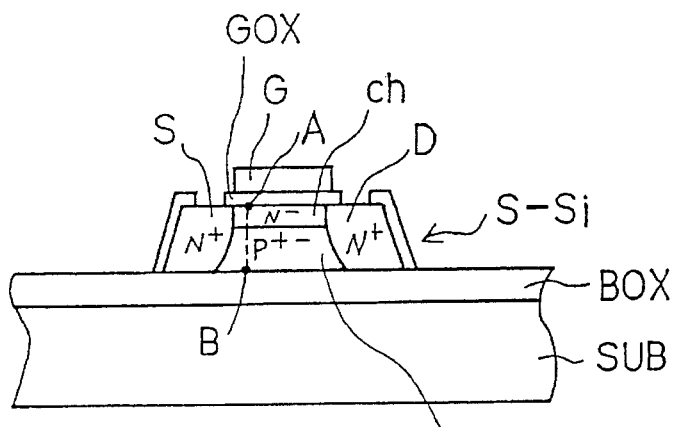
FIG. 5 is a sectional diagram showing one example of an inventive MIS transistor having a structure effective to suppress a leak current.
Figure 9:
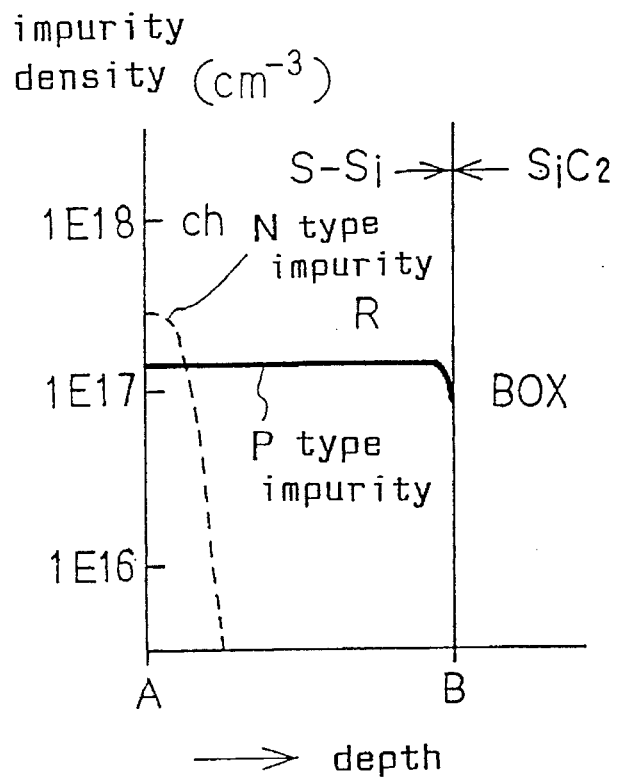
FIG. 9 is a graph showing an impurity density profile measured along the line A–B of FIG. 5.

FIG. 9 shows an impurity density profile taken along the line A–B of FIG. 5. As seen from this profile, the region R is doped with the P type impurity, the amount of which is greater than that of the prior art so as to supplement a deficiency of the P type impurity due to segregation at the boundary between S-Si and BOX. By this, inversion of the parasitic channel can be prevented prior to the inversion of the normal surface channel, thereby avoiding inadvertent conduction between the source region S and the drain region D. Further, the N type impurity is doped into the surface channel region Ch to reduce a relative or effective density of the P type impurity for effecting a desired threshold control.

Figure 6:
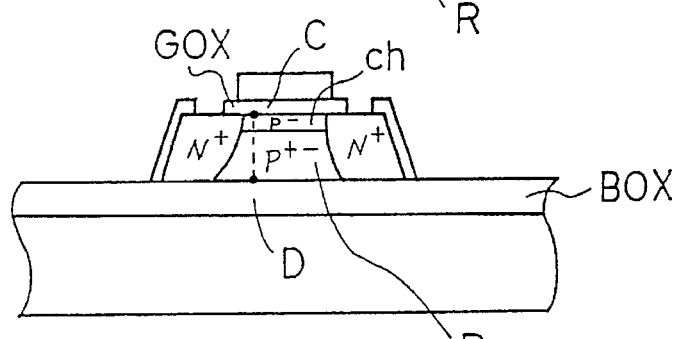
FIG. 6 is a sectional diagram showing an inventive MIS transistor having a channel structure of similar leak current suppression type.

FIG. 6 shows another embodiment directed to suppression of the parasitic channel, and being composed of a similar N channel MIS transistor formed on the SOI substrate. In this embodiment, a region R of the monosilicon layer is composed of a P type impurity layer disposed between the gate insulating film GOX and the dielectric material BOX. The density of the P type impurity is distributed such that the region R adjacent to the BOX has a thicker density than the channel region Ch.

Figure 10:
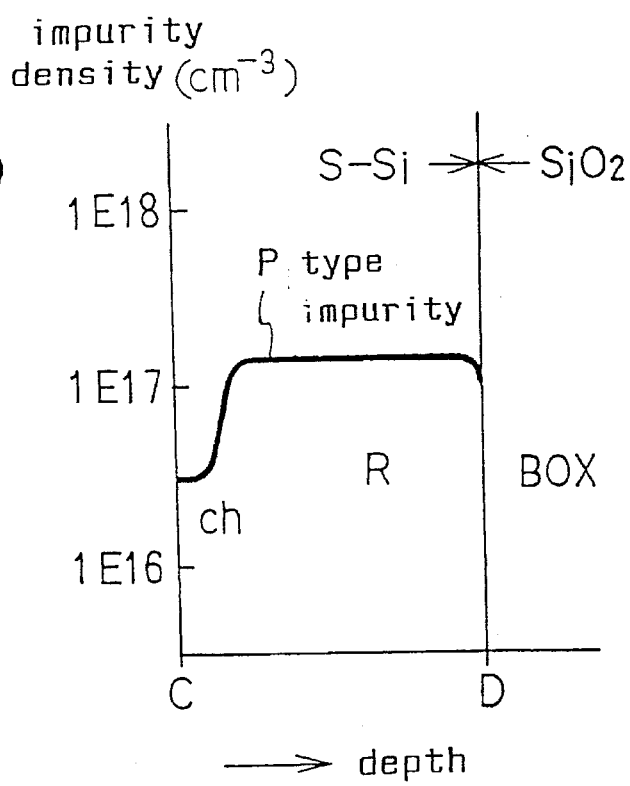
FIG. 10 is a graph showing another impurity density profile measured along the line C–D of FIG. 6.

FIG. 10 shows a density profile of the P type impurity taken along the line C–D of FIG. 6. Likewise, in this embodiment, the density of the P type impurity is set higher in the vicinity of the boundary adjacent to BOX so as to supplement density decrease due to segregation. On the other hand, the density of the P type impurity is lowered in the surface channel region Ch to obtain a desired threshold characteristic. Such a density profile can be established by adjusting an acceleration energy of impurity ions in ion implantation process.

Figure 7:
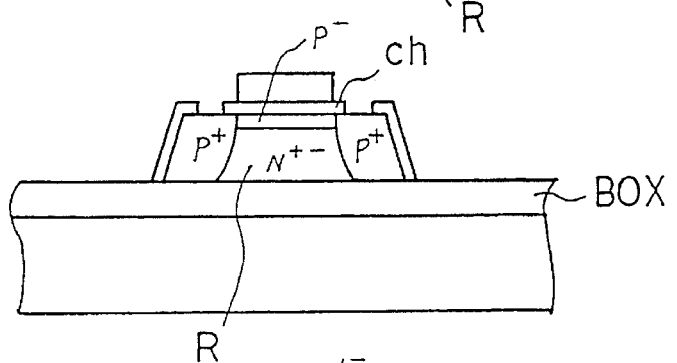
FIG. 7 is a sectional diagram showing an inventive MIS transistor having another channel structure of the leak current suppression type.

FIG. 7 shows a P channel MIS transistor formed in the SOI substrate, corresponding to the N channel MIS transistor shown in FIG. 5. Namely, the region R of the monosilicon layer adjacent to BOX contains an N type impurity, the density of which is set greater than that of the prior art, thereby suppressing a parasitic channel. On the other hand, the surface channel region Ch has a certain density of the N type impurity, which is lower than that of the region R to obtain a desired threshold characteristic.

Figure 8:
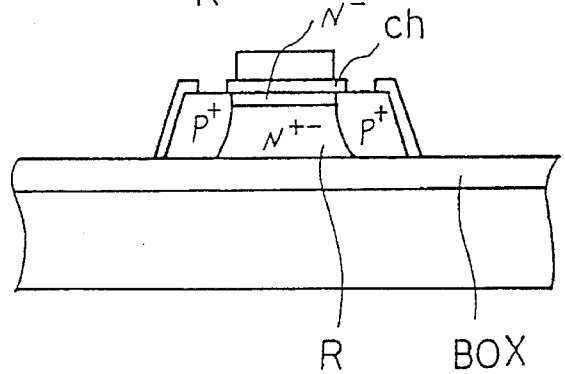
FIG. 8 is a sectional diagram showing an inventive MIS transistor having a similar leak current suppression structure.

FIG. 8 shows likewise a P channel MIS transistor formed on the SOI substrate, which corresponds to the N channel MIS transistor shown in FIG. 6. Namely, in this embodiment, the region R of the monosilicon layer adjacent to BOX contains an N type impurity having a relatively high density as compared to the prior art so as to suppress a parasitic channel. On the other hand, the surface channel region Ch has a density of the N type impurity which is set lower than that of the region R to thereby obtain a desired transistor threshold characteristic.

Next, referring to FIG. 11, a description is given in detail for a method of producing the FIG. 5 embodiment. First, an SOI substrate is prepared in Step one shown in FIG. 11(A). In this a SOI substrate, a monosilicon layer 103 having a thickness less than 1 μm is provided on a silicon substrate 101 through a silicon oxide film 102 which constitutes a dielectric material or a BOX. Subsequently, a P type impurity such as boron is doped by ion implantation at a given impurity density (for example, $1\times10^{17} cm^{-3}$) sufficient to avoid generation of a parasitic channel in the monosilicon layer 103, thereafter subjecting to diffusion and activation process. Namely, heating process is effected to establish a substantially uniform distribution of the P type impurity density in the monosilicon layer 103.

Figure 11A:
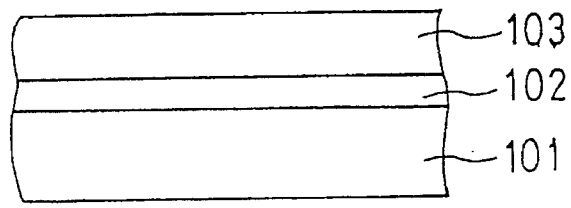
FIG. 11(A) to FIG. 11(D) are step diagrams showing a production method of the FIG. 5 MIS transistor.
Figure 11B:
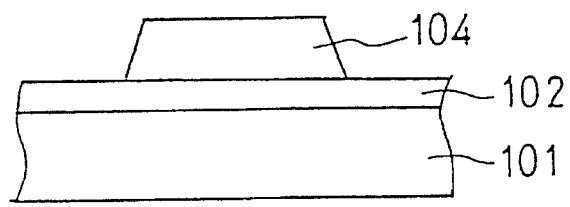

In Step two shown in FIG. 11(B), the monosilicon layer 103 is selectively removed by etching to leave a transistor device region 104 to thereby effect device isolation among individual transistors. Alternatively, the LOCOS method may be adopted for the device isolation. Further, the above noted doping process of the P type impurity may be carried out after the device isolation of Step (B).

Figure 11C:
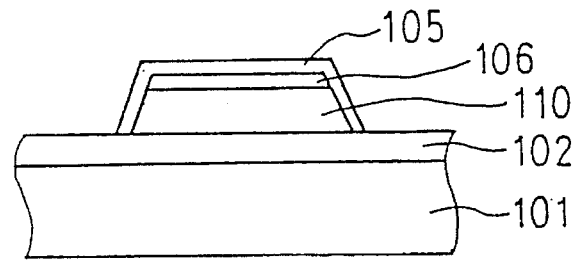

Next, in Step three shown in FIG. 11(C), a gate insulating film 105 of MIS transistor is formed by a thermal oxidation method or a CVD method. Thereafter, an N type impurity is doped by ion implantation into a surface area of the region previously doped with the P type impurity for the threshold control, thereby forming in a surface of the transistor device region 104 a channel region 106 in which the density of the P type impurity is effectively reduced. The N type impurity is preferably composed of As having a relatively small diffusion coefficient; however, phosphorus P or antimony Sb may be selected if desired.

Figure 11D:
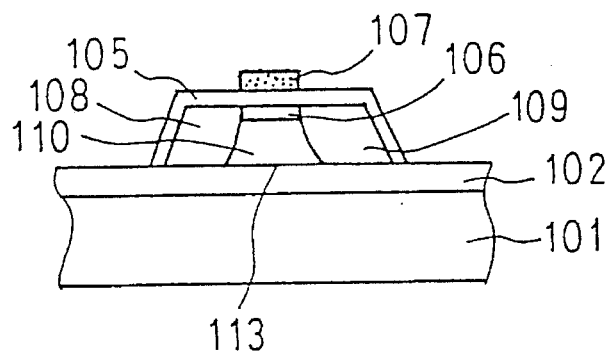

Lastly in Step four shown in FIG. 11(D), a gate electrode 107 is formed by an IC process. Further, an N type impurity is doped by ion implantation at a relatively great amount in self-alignment manner to form a pair of source region 108 and drain region 109, thereby providing a channel region 106 therebetween doped succeedingly with P type impurity, just under the gate electrode 107.

The source and drain regions 108, 109 are composed of an N type impurity layer which contacts with the silicon oxide film 102. In internal region 110 sandwiched by these regions is doped with a sufficient density of the P type impurity, effective to prevent generation of a parasitic channel along boundary 113 to the silicon oxide film 102. In the channel region 106 formed between the source region 108 and the drain region 109 along a surface layer of the device region, the threshold value of the N channel MIS transistor might be excessively boosted since the internal region 110 has a relatively high imparity density of the P type impurity. In order to lower the threshold to a practical level, the N type impurity is doped to effectively reduce the density of the P type impurity in the channel region 106. In the internal region 110 except the channel region 106, the impurity density is relatively high so that a junction capacitance may be increased between the source and drain regions 108, 109, and the internal region 110. However, practice the source and drain regions 108, 109 are contacted with the silicon oxide film 102, hence the junction capacitance is not increased as much as compared to the ordinary case where the impurity density is made higher in a bulk silicon wafer, thereby not hindering an operation speed of the transistor.

Figure 12:
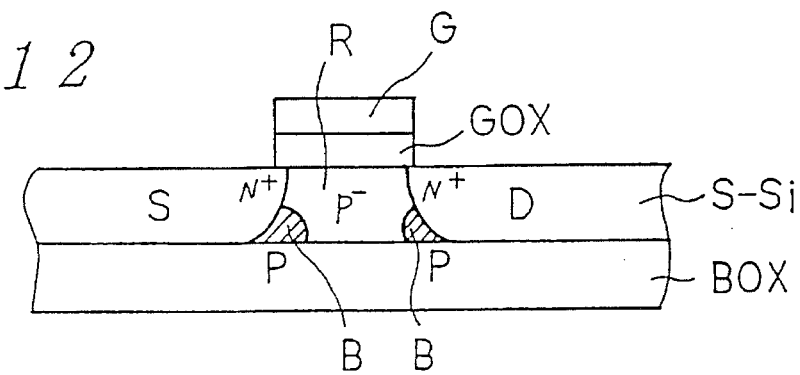
FIG. 12 is a sectional diagram showing an inventive MIS transistor having a leak current suppression structure.

FIG. 12 shows still another embodiment effective to suppress the parasitic channel. An N channel MIS transistor is formed on an SOI substrate. This MIS transistor is characterized in that an impurity of an opposite conductivity type to that of the source and drain regions is doped into a vicinity of the boundary between the dielectric material or BOX and the monosilicon layer S-Si, and adjacent to the opposed sides of the source and drain regions S, D. Specifically, the source and drain regions S, D have a density of N type impurity on the order of $10^{20} cm^{-3}$, while the internal region R between the regions S, D has a density of P type impurity on the order of $1\times10^{16} cm^{-3}$. Further, a region B adjacent to the source and drain regions S, D in the vicinity of the boundary between BOX and s-Si has a density of the P type impurity on the order of $1\times10^{17} cm^{-3}$. In such a manner, the region B adjacent to the regions S, D in the vicinity of the boundary has a higher density of the P type impurity than that of the internal region R, thereby efficiently suppressing a parasitic channel. This region B might suffer from reduction in the effective density of the P type impurity due to diffusion of an N type impurity from the source and drain regions S, D.

Figure 13:
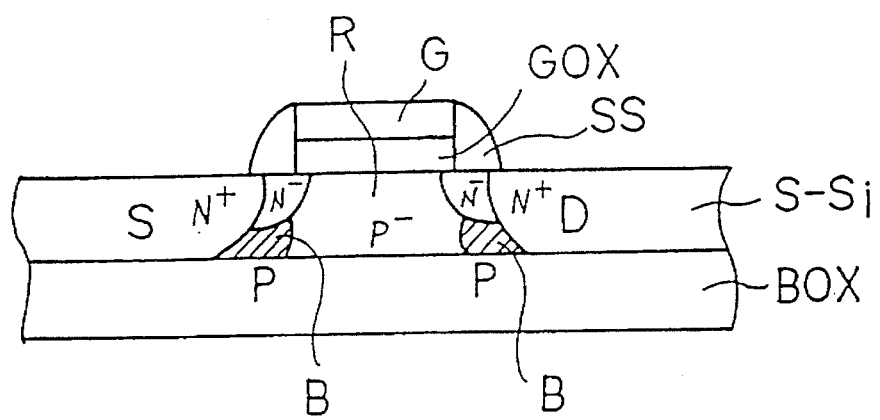
FIG. 13 is a sectional diagram showing an inventive MIS transistor of the LDD type having a similar leak current suppression structure.

FIG. 13 shows a still further embodiment which has basically the same construction as that of the FIG. 12 embodiment. A difference is in that the N channel MIS transistor has an LDD structure. Namely, an LDD region is formed by doping an N type impurity at a relatively low density as compared to that of the source and drain regions S, D. Each LDD region is disposed just under a side spacer SS composed of silicon dioxide formed on side walls of the gate electrode G. The region B just under the LDD region has a certain density of the P type impurity, set greater than that of the internal region R, thereby effectively suppressing a parasitic channel.

Figure 14:
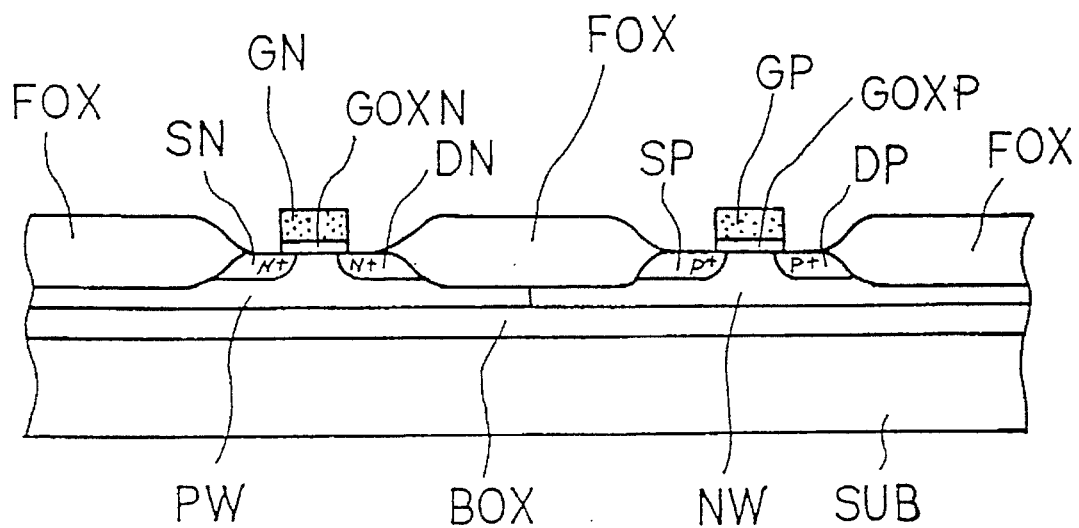
FIG. 14 is a sectional diagram showing an inventive complementary MIS transistor pair having a leak current suppression structure.

FIG. 14 shows a still further embodiment for suppressing a parasitic channel, in which a pair of complementary MIS transistors are formed on an SOI substrate. A silicon oxide film BOX is formed at a thickness of several tens nm–several μm on a monosilicon substrate SUB having a thickness of 500–700 μm. An N channel MIS transistor has a source region SN and a drain region DN, a depth of which can be controlled on the order of 0.3–0.5 μm. This N channel MIS transistor further includes a gate electrode GN composed of polysilicon, a gate insulating film GOXN composed of silicon oxide, and a P type well PW composed of a P type impurity region having a relatively low concentration. On the other hand, the P channel MIS transistor is comprised of a source region SP, a drain region DP, a gate electrode GP composed of polysilicon, a gate insulating film GOXP composed of silicon oxide, and an N type well NW composed of an N type impurity region having a low concentration. These complementary transistor devices are separated from each other by a field oxide film FOX composed of silicon dioxide. In this embodiment, the P type well refers to a region of the monosilicon layer where the N channel MIS transistor is formed, while the N type well refers to another region of the monosilicon layer where the P channel MIS transistor is formed. The P type well is composed of a P type impurity region having a low concentration formed by ion implantation, etc. Alternatively, if the SOI substrate has a monosilicon layer initially containing a P type impurity and a new P type impurity may not be doped by ion implantation or diffusion, a P type well may be defined in a region where an N channel MIS transistor is formed. The same is true for the definition of the N type well.

In the FIG. 14 embodiment, a bottom of the source and drain regions SN, SD of the N channel MIS transistor does not contact with BOX. Stated otherwise, the bottom is spaced from the boundary between BOX and PW where an inversion layer or a depletion layer might be induced, thereby avoiding a generation of a parasitic channel. Further, a bottom of the source and drain regions SP, DP of the P channel MIS transistor is also not contacted to BOX. In addition, a bottom of the field oxide film FOX does not contact with BOX.

Figure 15:
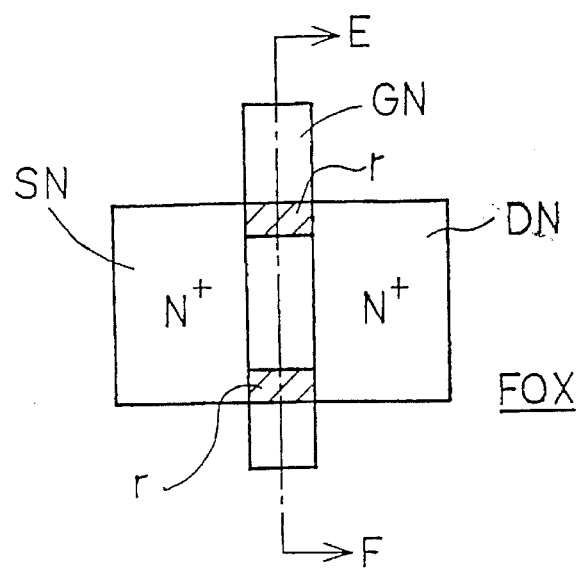
FIG. 15 is a schematic plan view illustrative of a generation mechanism of a parasitic channel.

FIG. 15 is a plan view showing the N channel MIS transistor formed on BOX. The source region SN and the drain region DN are separated at opposite sides by the gate electrode GN composed of polysilicon containing a high density of N type impurity. The field oxide film FOX composed of thick silicon dioxide covers a surface portion except for the source region SN, drain region DN and gate electrode G.

Figure 16:
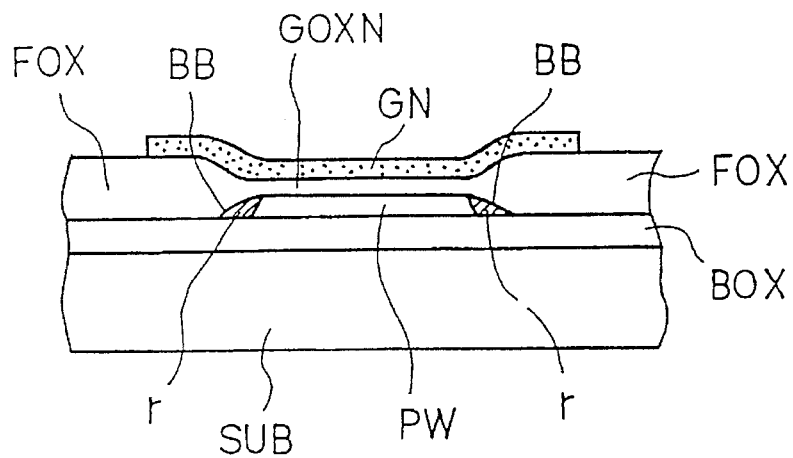
FIG. 16 is a sectional diagram taken along the line E–F of FIG. 15.

FIG. 16 shows a sectional structure taken along the channel widthwise direction of the N channel MIS transistor where the bottom of the field oxide film FOX contacts with the dielectric material BOX. Namely, the section is taken along the line E–F of FIG. 15. This figure shows those of monosilicon substrate SUB, dielectric material BOX, P type well PW, gate insulating film GOXN, field oxide film FOX and gate electrode GN. The source region SN and the drain region DN (not shown in the figure) are disposed forward and rearward, respectively, in the direction normal to the drawing paper, and therefore an electric current flows in the direction normal to the paper along the channel. The field oxide film FOX has an edge formed in a tapered shape called a "bird's beak" BB. After forming the field oxide film FOX, a hatched portion r of a very thin monosilicon layer remains under the bird's beak BB. Normally, boron is doped as a P type impurity into the P type well PW. When subjecting the monosilicon to an oxidation process, boron existing in the vicinity of silicon surface tends to migrate to the silicon oxide film due to the aforementioned segregation. By this, when forming the field oxide film FOX, a considerable amount of boron drifts from the region r of the monosilicon layer just under the bird's beak, to the field oxide film FOX. Consequently, the very thin monosilicon portion r just under the bird's beak has an impurity density of boron, which is considerably lower than that of the P type well just under the gate oxide film GOXN.

Normally, an insulated gate transistor of the field effect type has an electric path called a channel disposed under the gate insulating film. In the N channel MIS transistor, the higher the boron density in the channel region, the higher the threshold value of the gate voltage for conducting the channel. However, in the N channel MIS transistor formed on the SOI substrate, the bottom of the field oxide film FOX may contact with the dielectric material BOX as shown in FIG. 16, the portion r having a very thin boron density is formed to thereby lower the threshold valve at that portion. Additionally, in the case that the bottom of the source and drain regions contacts with BOX, this portion r of very low boron concentration may constitute a parasitic current path. The portion r under the bird's beak BB shown in FIG. 16 corresponds to the hatched portion r in FIG. 15. The portion r is positioned widthwise at side ends of the N channel MIS transistor to form a parasitic channel to thereby increase a leak current.

Figure 17:
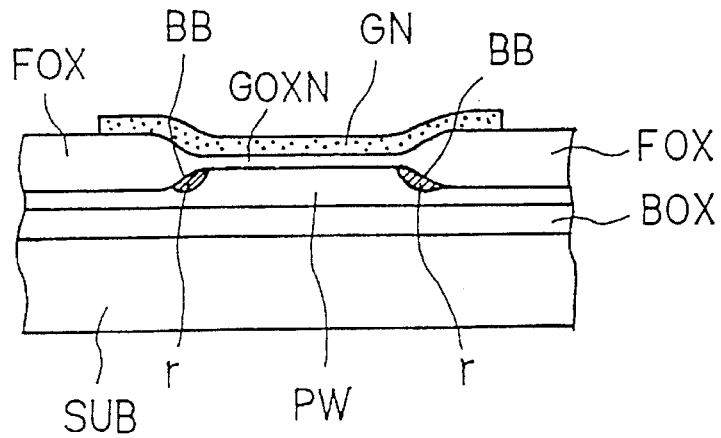
FIG. 17 is a schematic sectional diagram illustrative of a parasitic channel suppression structure.

In order to eliminate such a parasitic channel, the bottom of the field oxide film FOX is structurally spaced from the dielectric material BOX in the aforementioned FIG. 14 embodiment. In order to make clear this point, FIG. 17 shows a section of the N channel MIS transistor of the present embodiment, taken along the channel widthwise direction. Namely, the FIG. 17 structure corresponds to the FIG. 14 structure. As understood from this figure, the bottom of the field oxide film FOX is spaced from the dielectric material BOX. Accordingly, the monosilicon layer can remain at a substantial thickness under the bird's beak BB. Therefore, in the portion r under the bird's beak BB, the contained P type impurity of boron can be prevented from serious reduction of the density. Namely, when carrying out the LOCOS oxidation process of the monosilicon layer to form the field oxide film FOX, boron contained in the portion r under the birds beak BB migrates into FOX, while this portion r is supplied with boron from an underlaying monosilicon portion of the P type. Consequently in this construction, a parasitic channel can be effectively eliminated from the widthwise side ends of the channel of the N channel MIS transistor, in contrast to the FIGS. 15 and 16 constructions.

Figure 18:
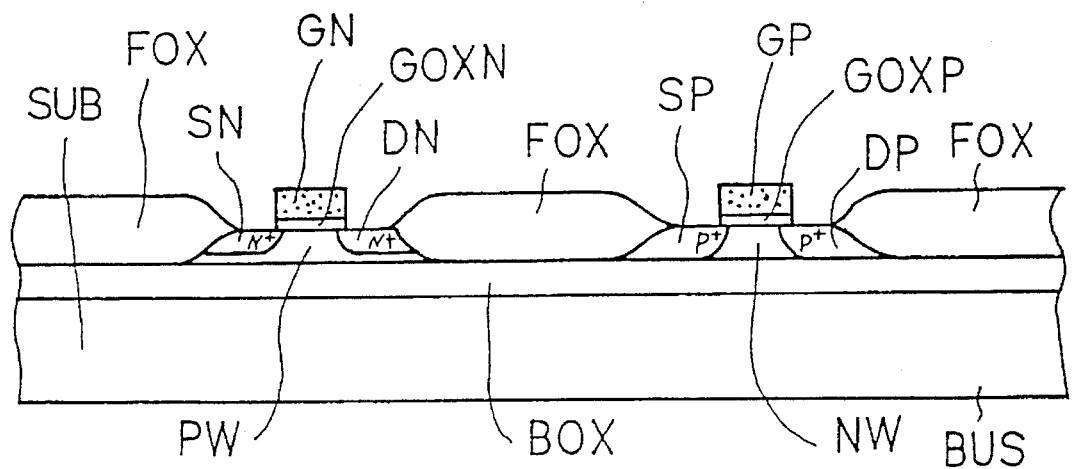
FIG. 18 is a sectional diagram showing an inventive complementary MIS transistor pair having a parasitic channel suppression structure.

FIG. 18 shows a variation of the FIG. 14 embodiment, and a corresponding reference is used for a corresponding part for facilitating understanding of the embodiment. The difference is such that a bottom of the source and drain regions SN, SD of the N channel MIS transistor does not contact with the BOX, while a bottom of the source and drain regions SP, DP of the P channel MIS transistor contacts with the BOX and also a bottom of the field oxide film FOX contacts with the BOX. As long as the bottom of the source and drain regions of the N channel MIS transistor does not contact with the BOX, a parasitic channel can be eliminated from widthwise channel ends of the N channel MIS transistor even though the bottom of the field oxide film contacts with BOX. Even if the bottom of the source and drain regions of the P channel MIS transistor contacts with the BOX, the P channel MIS transistor is relatively free from a parasitic channel as described before, thereby suppressing a leak current.

Figure 19:
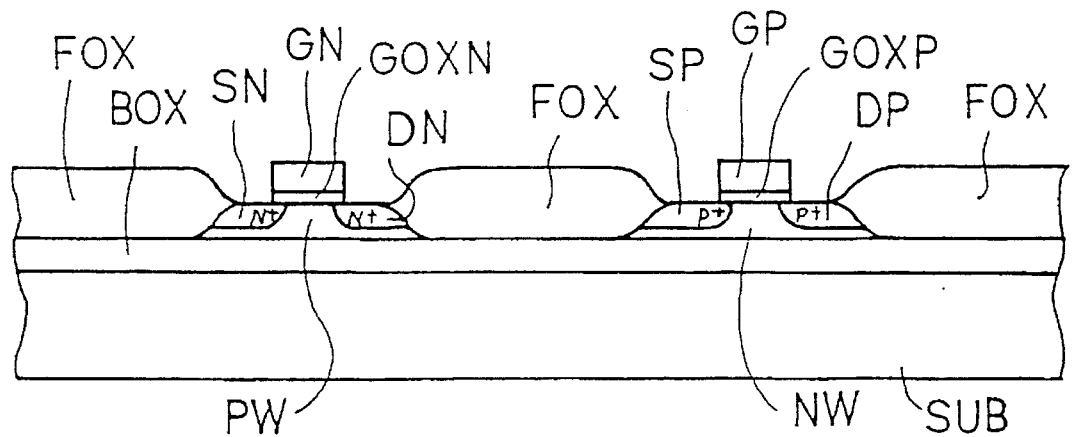
FIG. 19 is a sectional diagram showing another inventive complementary MIS transistor pair having a similar parasitic channel suppression structure.

FIG. 19 shows another modification of the FIG. 14 embodiment, and likewise the same reference is used for denoting a corresponding part for better understanding. The difference is such that while the bottom of the field oxide film FOX contacts with BOX, the BOX is spaced from those bottoms of source and drain regions SN, DN of the N channel MIS transistor, and also source and drain regions SP, DP of the P channel MIS transistor. In a manner similar to the FIG. 14 embodiment, a parasitic channel may not be produced in either of the N channel and P channel MIS transistors, thereby suppressing a leak current.

Figure 20:
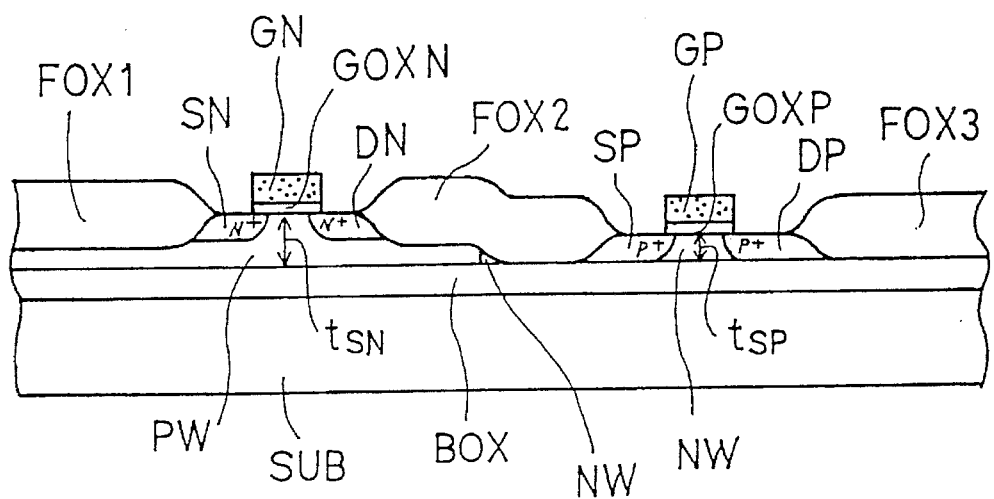
FIG. 20 is a sectional diagram showing a further inventive complementary MIS transistor pair having a similar parasitic channel suppression structure.

FIG. 20 is a schematic section showing a further variation of the FIG. 14 embodiment. The same reference denotes a corresponding part for better understanding. The difference is such that the BOX is spaced from a first field oxide film FOX1 disposed in a region of the P type well PW, a left half of a second central field oxide film FOX2, and source and drain regions, SN, DN of the N channel MIS transistor. On the other hand, the BOX contacts with a third field oxide film FOX3 disposed in a region of an N type well NW, a right half of the second field oxide film FOX2, and source and drain regions SP, DP of the P channel MIS transistor. In the modification of FIG. 20, as opposed to the embodiments shown in FIGS. 14, 18 and 19, the P type well PW formed with the N channel MIS transistor is composed of a thick monosilicon layer having a thickness $t_{SN}$ which is greater than a thickness $t_{SP}$ of a thin monosilicon layer constituting the N type well NW formed with the P channel MIS transistor. By such a construction, the source and drain regions SN, DN of the N channel MIS transistor can be spaced from the dielectric material layer BOX. Similarly to the FIGS. 18 and 19 embodiments, the FIG. 20 modification is free of a parasitic channel in either of the complementary MIS transistors, thereby advantageously suppressing a leak current.

A complementary pair of the MIS transistors are formed in those of the FIGS. 14, 18, 19 and 20 embodiments. However, the invention is not limited to this, and alternatively a bipolar transistor or other structure can be formed concurrently with the complementary MIS transistors. Namely, the semiconductor device according to the invention is not limited to a so-called CMOSIC, but may include BiCMOSIC and others.

Next, description will be given for embodiments directed to suppression of "bipolar action". A substrate potential of the monosilicon layer is floated in the transistor formed on the SOI substrate. Therefore, holes tend to be stored in the substrate of the N channel MIS transistor, while electrons tend to be stored in the substrate of the P channel MIS transistor. The storage of these carriers in the substrates may lower a barrier height (which is an integral potential of PN junction and is called "built-in potential") between the source region and the substrate, so that the carriers start to flow from the source region to the substrate. Such a bipolar action was described in conjunction with FIG. 28. The substrate potential must be fixed in order to prevent this bipolar action, and the following embodiments are directed thereto.

Figure 21:
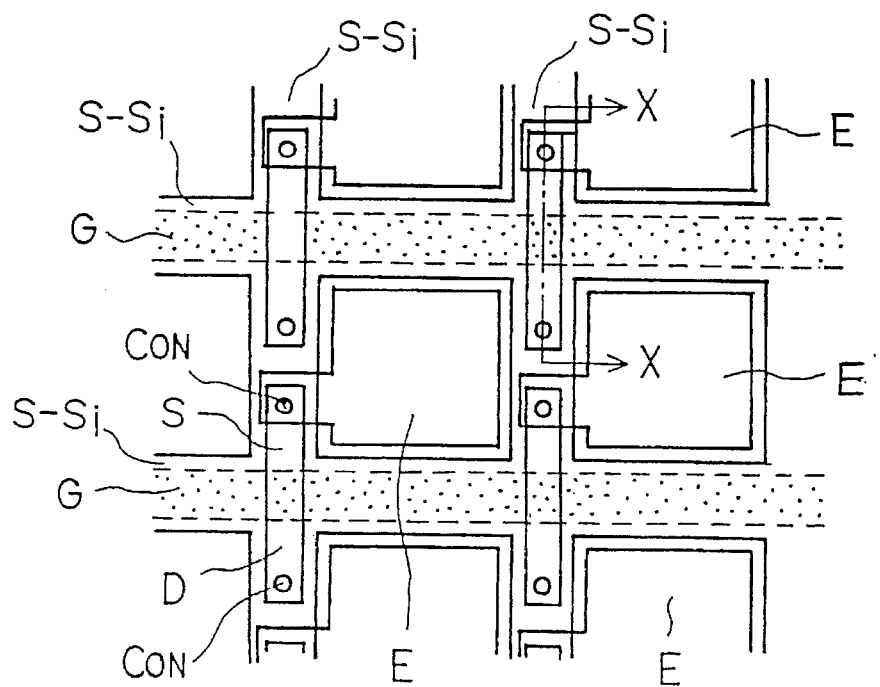
FIG. 21 is a plan view showing bipolar action.

Prior to the description of embodiments, brief discussion will be given for the background in conjunction with FIGS. 21, 22 for better understanding. FIG. 21 is a plan view showing a drive substrate utilized in a light valve of the active matrix type, and particularly showing a picture area. This picture area is formed on a monosilicon layer S-Si provided on a dielectric material (not shown). Scanning lines G are formed of a polysilicon in a row direction on the surface of the drive substrate. A part thereof constitutes a gate electrode. Further, a plurality of pixel electrodes E are formed in a matrix arrangement. The pixel electrode E is composed of a polysilicon having a thickness or the order of several tens nm, and therefore is substantially transparent. An individual transistor is comprised of source region S and drain region D formed of a high density impurity layer in a monosilicon. The source region S is connected to a corresponding pixel electrode E through a contact hole CON. Further, the drain region D is connected to a signal line (not shown) composed of metal such as aluminium through another contact hole CON.

Figure 22:
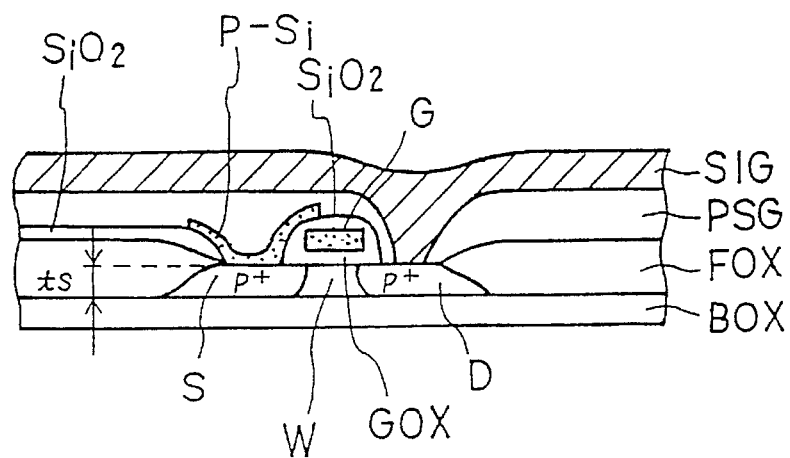
FIG. 22 is a sectional diagram taken along the line X—X of FIG. 21.

FIG. 22 shows a sectional structure of an individual transistor which constitutes a pixel switching element, taken along the channel lengthwise direction. Namely, the section is taken along the line X—X of FIG. 21 in case of the P channel MIS transistor. This transistor is provided with an N type well W containing an N type impurity. The gate electrode G is patterned as a part of the aforementioned scanning line over the well through a gate oxide film GOX. A pair of source and drain regions S, D containing a high density of P type impurity are formed both sides of the N type well w. Such a structure of the P channel MIS transistor is provided on an underlayer of silicon oxide film BOX. This transistor is surrounded by a field oxide film FOX for device isolation. The source region is connected to a pixel electrode (not shown) through a thin polysilicon film p-Si. The gate electrode G is coated by a silicon oxide film $SiO_2$ to electrically separate from the pixel electrode. The signal line SIG is composed of metal such as aluminium, and is connected to the drain region D of the transistor. The signal line SIG is electrically insulated from the pixel electrode by an intermediate insulating film PSG. In this embodiment, the N well W composed of N type impurity region and the source and drain regions S, D are formed in a monosilicon layer disposed on the dielectric material BOX. As shown in the figure, the monosilicon layer has a relatively small thickness ts, such that a bottom of the source and drain regions S, D directly contacts with the underlaying silicon oxide film BOX. Since the thickness ts of the monosilicon layer is rather thin, the bottom of the field oxide film FOX also contacts with the underlaying oxide film BOX. The potential of the N type well W must be fixed in order to stably operate such a construction of the transistor for pixel switching. However, the N type well W is completely surrounded by the field oxide film FOX, and is therefore isolated in an island shape. Stated otherwise, a portion of the monosilicon layer which constitutes the N type well W is separated from another portion of the monosilicon layer formed with a peripheral driver circuit, and is therefore difficult to provide a substrate potential internally.

Figure 23:
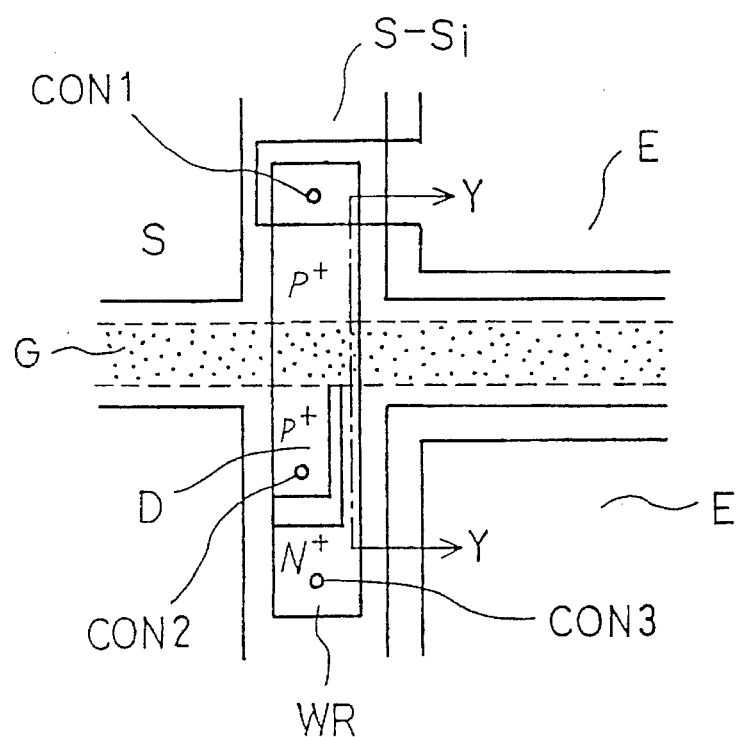
FIG. 23 is a plan view showing an embodiment having a structure where the substrate potential is fixed.

Thus, FIG. 23 shows a particular embodiment in which a substate potential of the pixel switching transistor is fixed in the drive substrate of the active matrix type light valve. A monosilicon layer S-Si is provided on a dielectric material (not shown), and is formed with individual pixel switching transistors. This drive substrate is formed with scanning lines G composed of polysilicon, a part of which constitutes a gate electrode of the transistor. Further, pixel electrodes E are formed of a polysilicon having a thickness of several tens nm. The transistor is provided with source and drain regions S, D composed of a high density P type impurity layer in the monosilicon layer S-Si. Another high density N type impurity region WR of the opposite conductivity type is provided in the vicinity of the drain region D. The source region S is connected to the pixel electrode E through a first contact hole CON1. The drain region D is connected to a signal line (not shown) composed of metal such as aluminum through a second contact hole CON2. Moreover the region WR of the high concentration of N type impurity is connected to another metal lead (not shown) composed of aluminum through a third contact hole CON3.

Figure 24:
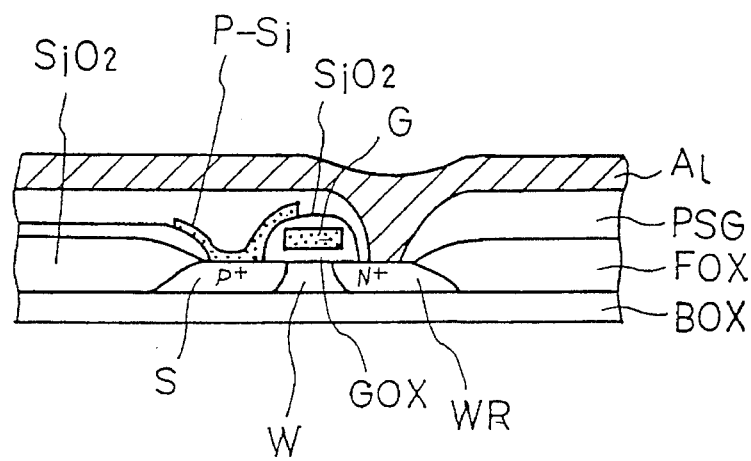
FIG. 24 is a sectional diagram taken along the line Y—Y of FIG. 23.

FIG. 24 shows a sectional structure of the pixel switching transistor, taken along the line Y—Y of FIG. 23. In this embodiment, the pixel switching element is comprised of the P channel MIS transistor. This transistor is formed in the N type well W containing the N type impurity. The gate electrode G is patterned as a part of the scanning line over the N type well W through a gate oxide film GOX. The N type well W is formed at opposite sides thereof with the source region S composed of a high density p type impurity layer, and the high density N type impurity region WR of the opposite conductivity type, respectively. Further, the drain region D (not shown) is provided behind the N type impurity region WR. This transistor is formed over the underlaying silicon oxide film BOX having a thickness in the order of serval hundreds nm to several μm. Its device region is isolated from other transistors by a field oxide film FOX. The source region S is connected to a pixel electrode (not shown) through a thin polysilicon film p-Si. Further, the gate electrode G composed of a polysilicon film is insulated from the pixel electrode composed of another polysilicon film by a silicon oxide film $SiO_2$. Further, the aluminum metal lead Al is connected to the above noted high density N type impurity region WR to provide thereto a ground potential. The aluminum lead Al is insulated from the pixel electrode by an intermediate insulating film PSG. The aluminum metal lead is extended from a peripheral driver circuit to electrically connect to the N type impurity region WR of the high density. Consequently, the N type well W adjacent to the N type impurity region WR of the high density can be also stably fixed to the ground potential level.

Figure 31:
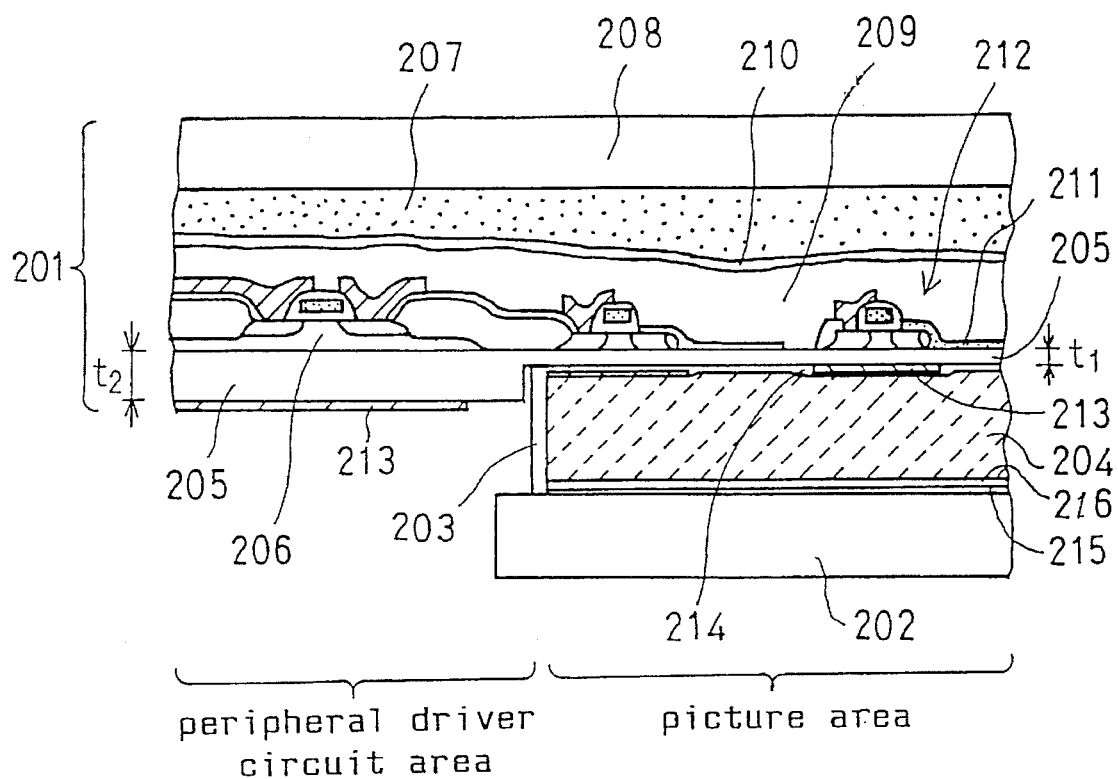
FIG. 31 is a schematic diagram showing a light valve of the active matrix type constructed by using the inventive semiconductor device.

FIG. 31 shows one embodiment of a light valve utilizing the inventive semiconductor device as a driver substrate, and specifically shows a liquid crystal light valve of the active matrix type. This light valve has a laminate structure where a drive substrate 201 composed of the inventive semiconductor device is coupled to a counter substrate 202 composed of transparent glass by a spacer 203, and an electro-optical material in the form of a liquid crystal 204 is filled between the pair of substrates. The driver substrate 201 has a multi-layer structure where an integrated circuit formed in a monosilicon layer 206 provided on a dielectric material 205 is transferred to a support member 208 by means of an adhesive layer 207. As described before, a passivation film 209 protects the integrated circuit, and a silicon oxynitride film or a silicon nitride film 210 is disposed as a top layer of the passivation film 209, thereby efficiently protecting the integrated circuit from degradation of its electrical characteristics due to water vapor and hydrogen gas contained in the adhesive layer 207. The driver substrate 201 is divided into a peripheral driver circuit area and a picture area. The picture area is formed integrally with pixel electrodes 211 arranged in matrix and pixel switching elements 212 for driving the pixel electrodes 211. The peripheral driver circuit area is masked by a light shield film 213 from a rear face. Further, the pixel switching elements 212 are also masked by the light shielding film 213 from the rear face. The dielectric material 205 has a thickness t2 in the peripheral driver circuit area, which is set greater than another thickness t1 of the dielectric material disposed in the picture area. Particularly, the reduction in thickness of the dielectric material 205 of the picture area may improve an efficient electric field application to the liquid crystal 204.

An orientation film 214 is formed on a rear face over the picture area of the driver substrate 201. Further, the counter substrate 202 is provided on its inner front face with a common electrode 215 and another orientation film 216.

Figure 32:
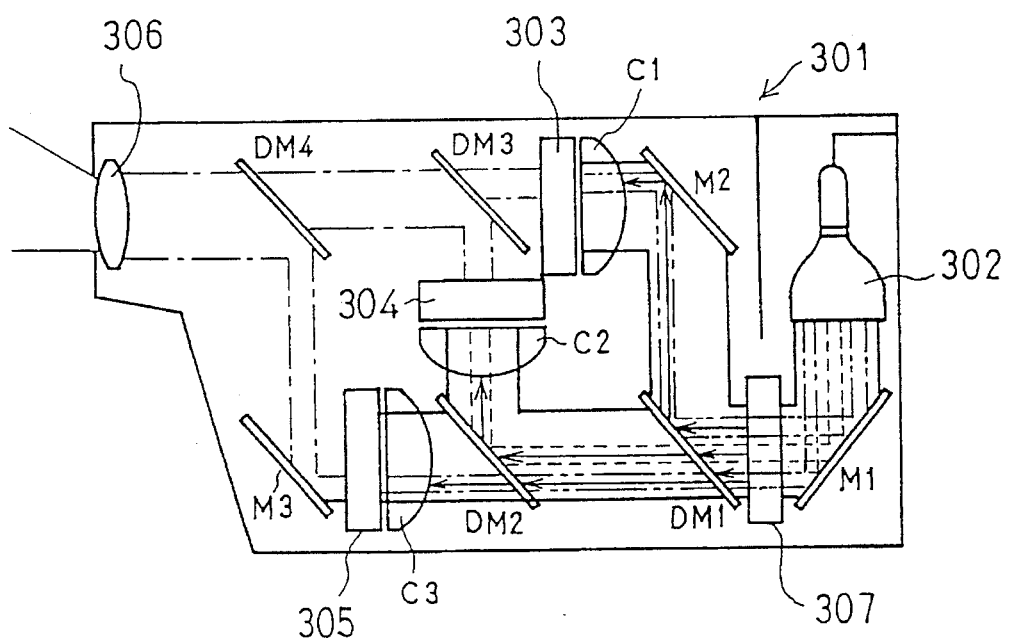
FIG. 32 is a schematic diagram showing an image projector constructed by using the FIG. 31 light valve.

FIG. 32 shows an image projector utilizing the FIG. 31 light valve of the transmission type. This image projector 301 is comprised of a light source 302 such as a lamp, and three light valves 303–305. The light source 302 illuminates the light values 303–305 so that images on the respective light valves are projected expandingly by an optical lens 306. In this embodiment, the three valves are utilized correspondingly to respective images of three primary colors R, G and B. The source light is reflected by a first mirror M1, thereafter passes through a filter 307, and is then split by a first dichroic mirror DM1 into a R component, and remaining G and B components. The R component is reflected by a second mirror M2, and thereafter passes a condenser lens C1 to irradiate the first light valve 303. On the other hand, the G component is divided out by a second dichroic mirror DM2, and thereafter irradiates the second light valve 304 through a condenser lens C2. The last B component irradiates the third valve 305 through a condenser lens C3. The R, G and B components passing the respective light valves are combined together by dichroic mirrors DM3, DM4 and a mirror M3, and are projected expandingly by the optical lens 306.

As described before, each respective light valve is comprised of a driver substrate formed with pixel electrodes, and a driver circuit for activating the pixel electrodes according to a given signal, a counter substrate opposed to the driver substrate, and an electro-optical material layer composed of liquid crystal or else disposed between the driver and counter substrates. The driver substrate includes a transparent dielectric material, a single crystal semiconductor layer formed on the transparent dielectric material, and a light shielding layer provided on a rear face of the transparent dielectric material in opposed relation to the single crystal semiconductor layer. The driver circuit contains transistor elements formed in the single crystal layer. The light shielding layer is provided to mask an active portion of each transistor element. The pixel electrodes are integrally formed in the single crystal semiconductor layer, and is electrically connected to the driver circuit. The driver circuit activates the pixel electrodes to act on the electro-optical material to control transmittance thereof to thereby perform light valve function.

Figure 33:
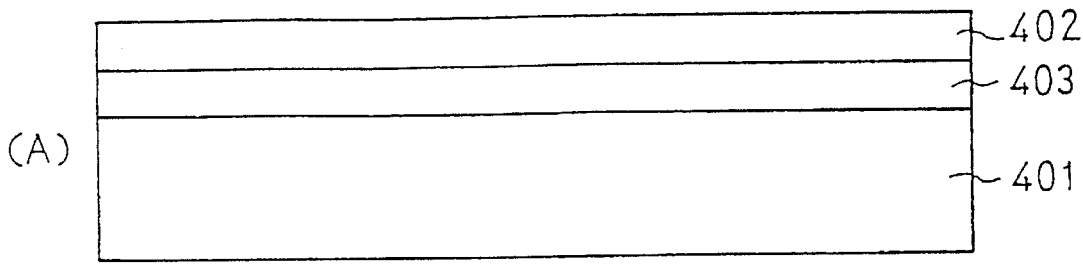
FIG. 33(A) to FIG. 33(C) are step diagrams showing a production method of the inventive light valve.
Figure 33:
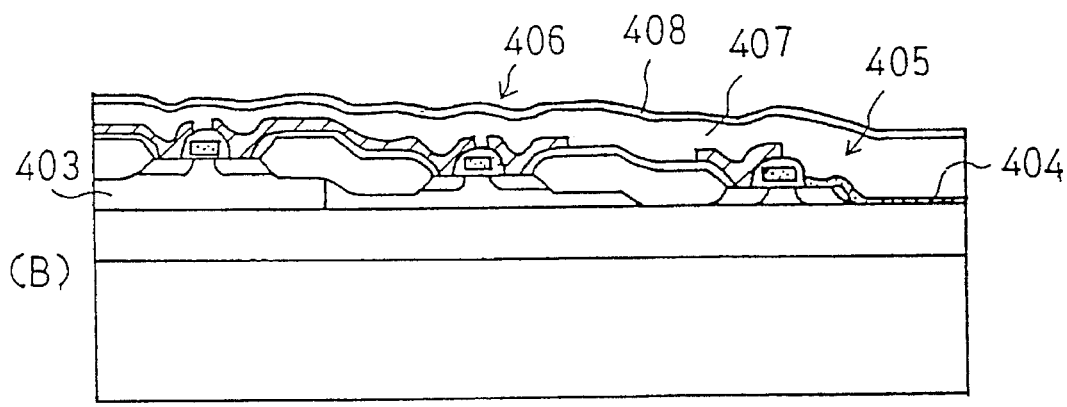
Figure 33:
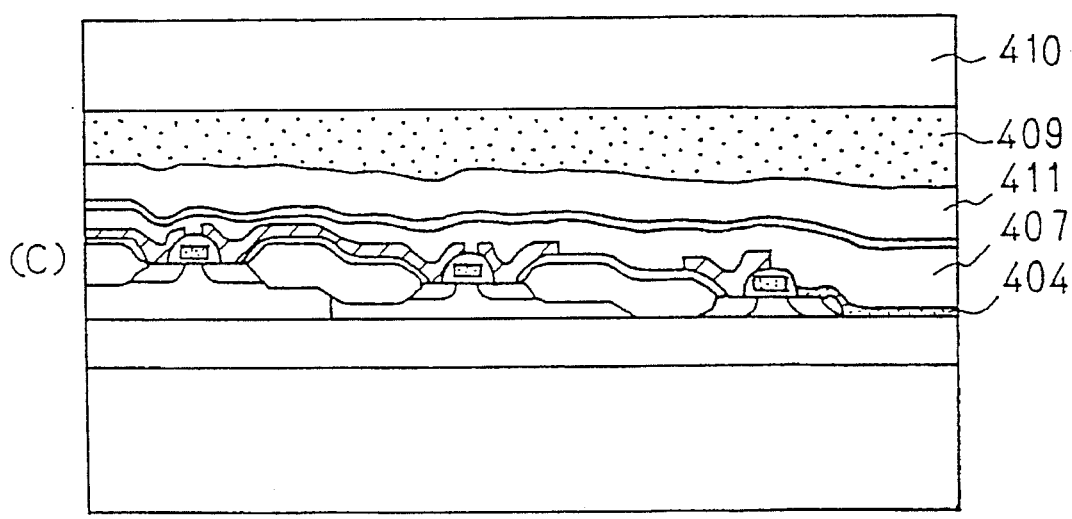
Figure 34:
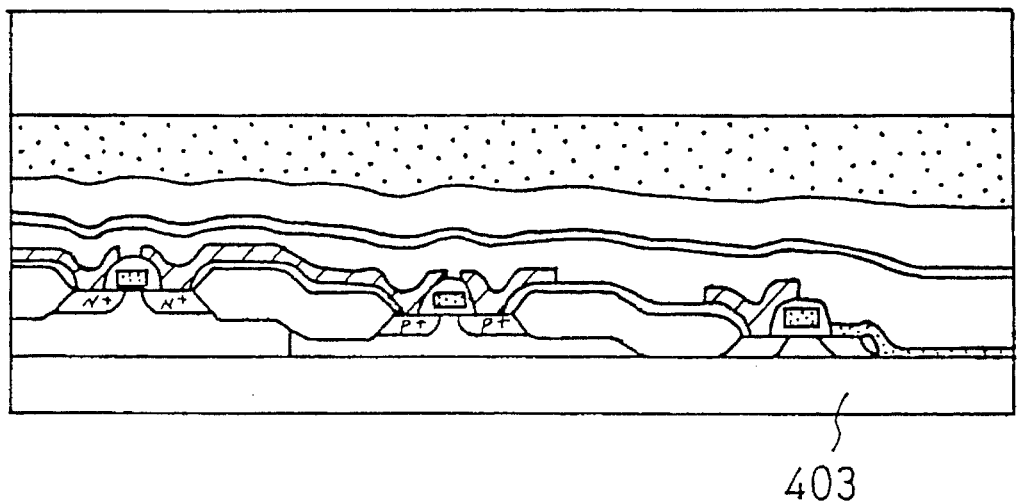
FIG. 34(A) and FIG. 34(B) are step diagrams showing production method of the inventive light valve.
Figure 34:
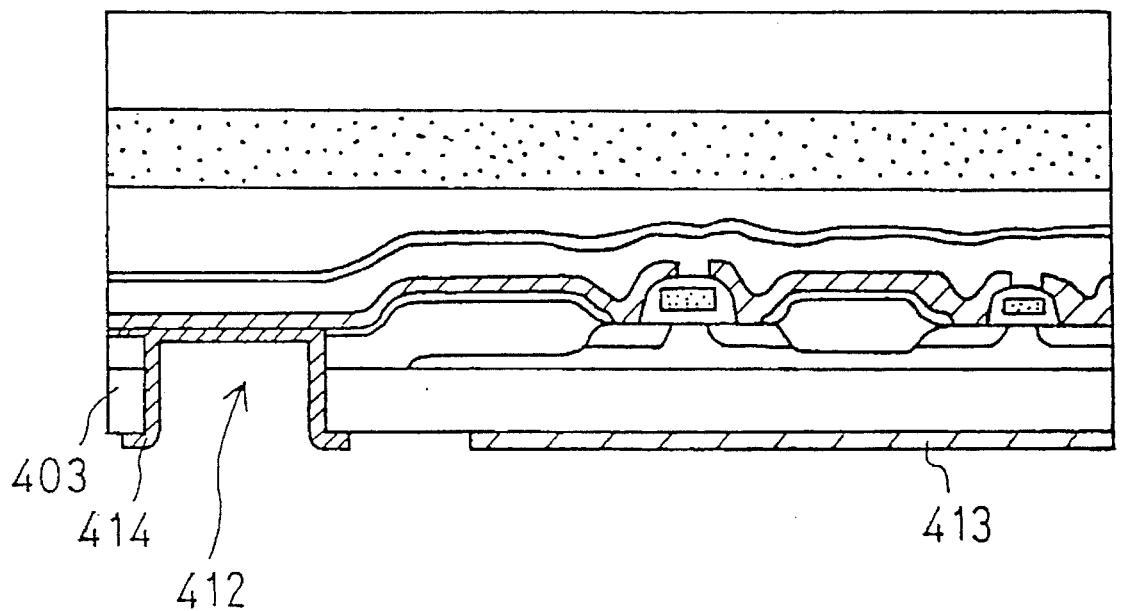

Next, the description is given for a method of producing a light valve in conjunction with FIGS. 33 and 34. In the first step shown in FIG. 33(A), there is prepared an SOI substrate composed of a three-layer structure in which a temporary substrate 401 and a single crystal semiconductor layer 402 are laminated with each through a transparent dielectric material 403. In this embodiment, the temporary substrate 401 is composed of monosilicon having a thickness of 500–700 μm, the single crystal semiconductor layer 402 is composed of a thin film monosilicon having a thickness about 1 μm, and the transparent dielectric material 403 is composed of silicon dioxide having a thickness about 1 μm.

Next, in the second step shown in FIG. 33(B), a pixel electrode 404 is formed in a portion where the single crystal semiconductor layer 403 is selectively removed, or in a portion where a silicon dioxide film is selectively formed over the SOI substrate. Further, the single crystal semiconductor layer 403 is formed with a pixel switching element 405 and a driver integrated circuit 406 for selectively feeding a signal to each pixel switching element 405. Further, the driver is coated by a passivation film 407. The top layer 408 of this passivation film 407 is composed of a silicon oxynitride film or a silicon nitride film as described before.

In the third step shown in FIG. 33(C), a support member 410 is mounted through an adhesive layer 409 on the surface of the SOI substrate formed with the pixel electrodes 404 and the driver. Preferably, a leveling layer 411 is interposed between the passivation film 407 and the adhesive layer 409.

Next, in the fourth step shown in FIG. 34(A), the temporary substrate is removed to expose the transparent dielectric material 403. The removal of the temporary substrate is carried out by an etching process with using the transparent dielectric material 403 as an etching stopper.

In the fifth step shown in FIG. 34(B), a through-hole 412 is formed in a given location of the exposed transparent dielectric material 403. Further, a metal film is formed entirely over the exposed transparent dielectric material 403. Subsequently in the sixth step, the metal film is patterned to Form a light shielding layer 413 which covers partly or entirely the driver as well as to concurrently form an electrode pad 414. This electrode pad 414 is electrically connected to the driver through the through-hole 412 to provide an external electrode lead. Lastly, in the seventh step, though not shown in the figure, a counter substrate provisionally formed with a transparent electrode is fixed to the rear face of the drive substrate formed with the light shielding layer, with leaving a gap. Then, an electro-optical material is filled in the gap to complete the light valve.

Lastly, the description is given for the method of producing the SOI substrate used for making the semiconductor device according to the invention. Currently, the SOI substrate using a monosilicon is classified into two types of wafer. The first type is produced such that oxygen atoms are ion-implanted into a monosilicon substrate at a given depth, and thereafter the substrate is annealed. Such a type of the SOI wafer is called SIMOX. This wafer features that the monosilicon of the SOI layer has a very small variation of thickness. However, unless the thickness of the SOI silicon layer is less than 0.2 μm, the SIMOX wafer cannot obtain a good quality of the monosilicon layer after annealing. In case that the monosilicon of the SOI layer has such a thin thickness, a bottom of source and drain regions of both the N channel and P channel MIS transistors may contact with the BOX, thereby failing to eliminate a parasitic channel.

Figure 35:
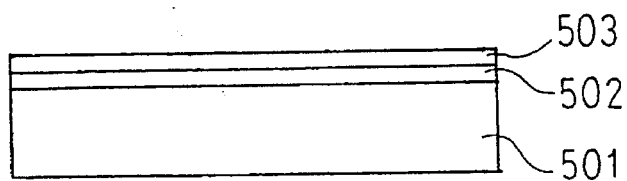
FIG. 35(A) to FIG. 35(D) are schematic diagrams showing examples of SOI substrates used in the production of the inventive semiconductor device.
Figure 35:
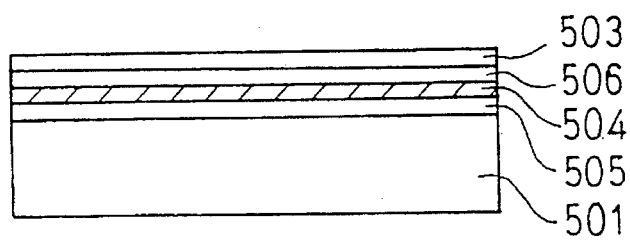
Figure 35:
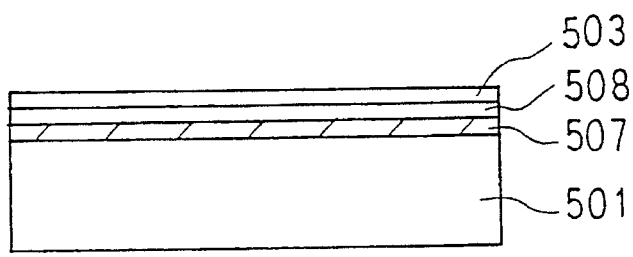
Figure 35:
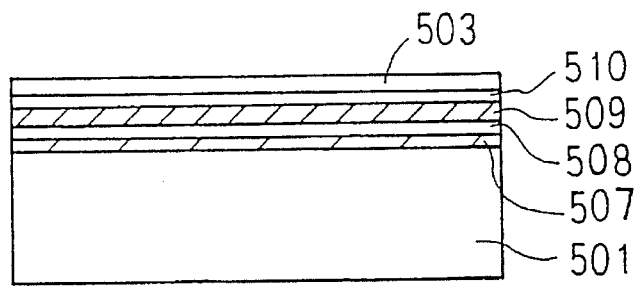

In view of this, the present invention mainly utilizes an SOI substrate produced by bonding method. FIG. 35(A) to FIG. 35(D) show various examples of the bonded SOI substrate. The SOI substrate shown in FIG. 35(A) is a most basic one in which a monosilicon layer 503 is bonded onto a monosilicon substrate 501 through a silicon oxide film 502.

In the SOI substrate shown in FIG. 35(B), three layers of electrically insulative material are interposed between the monosilicon substrate 501 and the monosilicon thin film 503. This electrically insulative material is composed of an intermediate silicon nitride layer 504 sandwiched by upper and lower silicon oxide layers 505, 506. The silicon nitride layer generates an internal tension strain. On the other hand, the silicon oxide layer generates a compression strain. These layers are laminated with one another to cancel the tension and compression strains to each other to thereby reduce an overall stress.

In the SOI substrate shown in FIG. 35(C), double layers of silicon nitride 507 and silicon oxide 503 are interposed between the monosilicon substrate 501 and the monosilicon film 503. In similar manner, the tension and compression strains are canceled with each other to eliminate bending deformation from the SOI substrate.

In the SOI substrate shown in FIG. 35(D), further double layers of silicon nitride 509 and silicon oxide 510 are added to the structure of the aforementioned SOI substrate shown in FIG. 35(C).

Lastly, though not specifically referring to the drawings, the description will be given for basic process of producing the inventive semiconductor device for summary. In the first step, an SOI substrate is formed such that a single crystal semiconductor layer is laminated on a temporary substrate through an electrically insulative material. In the second step, an integrated circuit is formed in the single crystal semiconductor layer. In the third step, a support member is fixed by adhesive to a surface of the formed integrated circuit oppositely to the temporary substrate. In the fourth step, the temporary substrate is removed to expose a flat rear face of the electrically insulative material. Lastly in the fifth step, at least an electrode is formed on the exposed flat face of the electrically insulative material. Preferably, in the first step, a semiconductor substrate composed of monosilicon is fixed to the temporary substrate composed of silicon through the electrically insulative material composed of silicon dioxide by thermal pressing. Therefore, the semiconductor substrate is polished into a thin film to thereby form the SOI substrate having a monosilicon layer. Further preferably, in the first step, a silicon nitride layer is deposited on the temporary substrate composed of silicon as an underlayer, and subsequently a silicon dioxide layer is deposited by CVD to thereby form the electrically insulative material. Thereafter, the semiconductor is fixed by thermal pressing. Further, in the fourth step, the temporary substrate is removed by etching or combination of etching and polishing with using the silicon dioxide layer or silicon nitride layer as an etching stopper. Moreover, in the third step, the support member is fixed by means or an adhesive containing mainly silicon dioxide. Alternatively, an adhesive is applied to a surface of the integrated circuit, and is then cured to form a single layer of the support member.

As described above, according to the invention, the semiconductor device is constructed such that the integrated circuit formed in the SOI substrate is transferred to the transparent support member by means of an adhesive layer. In this structure, a silicon oxynitride film or silicon nitride film is utilized as a top layer of the passivation film for coating the integrated circuit, thereby advantageously blocking water and hydrogen contained in the adhesive layer to prevent degradation of the electrical characteristics of the integrated circuit to improve its reliability. Further, a leveling layer may be interposed between the adhesive layer and the passivation film in transferring of the integrated circuit, thereby advantageously improving the adhesion strength. Particularly, the leveling layer can be composed of silicon dioxide material, which does not affect the integrated circuit, thereby advantageously and stably maintaining the reliability. The inventive semiconductor device can be used as a drive substrate for a light valve of the active matrix type. In such a case, a switching transistor contained in a picture area can be composed of polysilicon or amorphous silicon, thereby advantageously suppressing a photoelectric leak current. On the other hand, the peripheral driver circuit may be composed of transistors utilizing the monosilicon as it is, thereby advantageously realizing a driver circuit having high driveability, small device size and fast operation speed.

Further, according to the invention, an impurity having an opposite conductivity type to the source and drain regions are doped into the boundary between the monosilicon layer and the dielectric material BOX by a relatively high density, thereby advantageously suppressing a parasitic channel. Particularly, the bottom of source and drain regions of the N channel MIS transistor may be spaced from the underlaying dielectric material, thereby advantageously preventing a parasitic channel. Similarly, the bottom of the field oxide film surrounding a device region of the N channel MIS transistor may be spaced from the underlaying dielectric material, thereby advantageously eliminating a parasitic channel.

In case that the inventive semiconductor device is utilized as a drive substrate of the light valve, the switching transistor element formed in the picture area may be irradiated by an incident light. In view of this, the size of the pixel switching transistor is set smaller than that of the peripheral driver circuit transistor, thereby avoiding increase in a photoelectric current. Particularly, the pixel switching element can be composed of a P channel MIS transistor, which is effective to suppress a leak current, thereby advantageously improving ON/OFF characteristic. Further, the pixel switching transistor is formed in a region where monosilicon layer has a relatively small thickness as compared to another region of the monosilicon layer where the peripheral driver transistor is formed, thereby advantageously suppressing a leak current.

In addition, the substrate potential of the transistor is fixed in the monosilicon layer, thereby advantageously supressing a leak current due to bipolar action.

According to the invention, the SOI substrate produced by the bonding method is adopted to thereby provide the semiconductor device having low production cost and high reliability. Particularly, double layers of a nitride film and an oxide film are used as an electrically insulative material interposed between the monosilicon layer and the monosilicon substrate so that tension strain and compression strain are canceled with each other, thereby advantageously preventing deformation of the SOI substrate.

Additionally, in case that the inventive semiconductor device is used as a drive substrate in the light valve, the exposed dielectric material has a relatively small thickness in the picture area, thereby advantageously generating an electric field to drive the light valve.

What is claimed is:

1. A semiconductor device, comprising: an electrically insulative material, a monosilicon layer disposed on the insulative material and having at least an integrated circuit formed thereon, a passivation film covering at least the integrated circuit, an adhesive layer disposed on the passivation film, and a support member fixed to the electrically insulative material through the adhesive layer to support the monosilicon layer, the integrated circuit comprising an MIS transistor having a source region, a drain region and a channel region each being formed in the monosilicon layer.

2. A semiconductor device according to claim 1, wherein the passivation film has a top layer comprising one of a silicon oxynitride film and a silicon nitride film.

3. A semiconductor device according to claim 1, further comprising a leveling layer interposed between the passivation film and the adhesive layer.

4. A semiconductor device according to claim 3, wherein the leveling layer comprises a silicon oxide.

5. A semiconductor device according to claim 1, including an insulative film which is transformed from a given region of the monosilicon layer, a semiconductive layer comprising one of a polysilicon layer and an amorphous silicon layer formed on the insulative film and having a switching element group for switching pixels of an active matrix display, and a driver integrated circuit formed in the remaining region of the monosilicon layer for driving the switching element group.

6. A semiconductor device according to claim 1, wherein the monosilicon layer is formed with a switching element group for switching pixels of an active matrix display and a driver integrated circuit for driving the switching element group.

7. A semiconductor device according to claim 6, wherein the switching element group and the driver integrated circuit comprise MIS transistors of an electric field effect type having a metal/insulator/semiconductor structure.

8. A semiconductor device according to claim 6, wherein the switching element group comprises an MIS transistor of a P channel type.

9. A semiconductor device according to claim 6, wherein the switching element group contains an individual switching element for selectively activating a group of pixel electrodes formed on the electrically insulative film, and the individual switching element has disposed around its vicinity a high impurity region having the same electroconductivity type as that of a substrate composed of the monosilicon layer.

10. A semiconductor device according to claim 7, wherein the MIS transistor of the switching element group has a certain product value of its length and width, smaller than that of the MIS transistor contained in the driver integrated circuit.

11. A semiconductor device according to claim 1, wherein the MIS transistor comprises a single crystal semiconductor substrate composed of a region of the monosilicon layer containing an impurity of a first electroconductivity type, the source region and the drain region being formed in the single crystal semiconductor substrate and containing another impurity of a second electroconductivity type, and the channel region being formed on a surface of the single crystal semiconductor substrate between the source region and the drain region, and wherein an impurity of the first electroconductivity type is doped between the source and the drain regions at a certain density sufficient to suppress generation of a parasitic channel, and another impurity of the second electroconductivity type is doped into the channel region for controlling a threshold voltage.

12. A semiconductor device according to claim 11, wherein the source and the drain regions formed in the single crystal semiconductor substrate are spaced apart from the electrically insulative film.

13. A semiconductor device according to claim 1, wherein the integrated circuit formed in the monosilicon layer contains an MIS transistor of an electric field effect type having a metal/insulator/semiconductor structure, the MIS transistor comprising a single crystal semiconductor substrate composed of a region of the monosilicon layer containing an impurity of a first electroconductivity type, a pair of source and drain regions formed in the single crystal semiconductor substrate and containing another impurity of a second electroconductivity type, a channel region formed on a surface of the single crystal semiconductor substrate between the source and drain regions, and a gate electrode disposed on the channel region through a gate insulating film, and wherein a part of the single crystal semiconductor substrate positioned between the gate insulating film and the electrically insulative material comprises an impurity layer of one electroconductivity type, having a relatively thin density in the channel region as compared to a lower region in the vicinity of a boundary to the electrically insulative material.

14. A semiconductor device according to claim 1, wherein the MIS transistor includes an impurity region having an opposite electroconductivity type to that of the source and the drain regions, and being formed in the vicinity of a boundary between the electrically insulative material and the monosilicon layer at locations adjacent to the source and drain regions.

15. A semiconductor device according to claim 1; wherein the integrated circuit formed in the monosilicon layer comprises a pair of MIS transistors of a complementary type having a metal/insulator/semiconductor structure, wherein an N type MIS transistor is formed in a thick portion of the monosilicon layer, and a P type MIS transistor is formed in a thin portion of the monosilicon layer which is thinner than the thick portion thereof.

16. A semiconductor device according to claim 1, wherein the integrated circuit formed in the monosilicon layer has a pair of MIS transistors of a complementary type having a metal/insulator/semiconductor structure, wherein an N type MIS transistor has a pair of source and drain regions spaced apart from the electrically insulative material.

17. A semiconductor device according to claim 1, wherein the integrated circuit formed in the monosilicon layer has a pair of MIS transistors of a complementary type having a metal/insulator/semiconductor structure, wherein an N type MIS transistor is formed in one of a P type impurity region and a P well region which includes a field oxide film spaced apart from the electrically insulative material.

18. A semiconductor device according to claim 7, wherein a thickness of a region of the monosilicon layer where the driver integrated circuit is formed is thicker than that of a region of the monosilicon layer where the switching element group is formed.

19. A semiconductor device according to claim 1; including a pixel switching element group for an active matrix display formed in one of a region of the monosilicon layer and a region composed of one of a polysilicon layer and an amorphous silicon layer disposed on an insulating film composed of a silicon oxide which is transformed from the monosilicon layer by oxidation, and a driver integrated circuit formed in another region of the monosilicon layer for driving the pixel switching element group, wherein the pixel switching element group is disposed on a part of the electrically insulative material having a small thickness while the driver integrated circuit is disposed on another part of the electrically insulative material having a greater thickness than the small thickness.

20. An image projection apparatus having a light source for irradiating a light valve, and an optical lens for projecting an enlarged image displayed on the light valve, the light valve comprising: a drive substrate having pixel electrodes and a drive circuit for driving the pixel electrodes according to a given signal, a counter substrate opposed to the drive substrate, and an electro-optical material layer interposed between the drive substrate and the counter substrate;

the drive substrate comprising a transparent electrically insulative layer, a single crystal semiconductor layer formed on the transparent electrically insulative layer, and a light mask layer disposed on a surface of the transparent electrically insulative layer in opposite relation to the single crystal semiconductor layer;

the drive circuit including a transistor element formed in the single crystal semiconductor layer, the light mask layer being formed to cover an active part of the transistor element; and the pixel electrodes being arranged integrally in the single crystal semiconductor layer and being electrically connected to the drive circuit such that the drive circuit drives the pixel electrodes to activate the electro-optical material layer to control its optical transmittance.

21. A semiconductor device, comprising: an electrically insulative material, a monosilicon layer disposed on the insulative material and having at least an integrated circuit formed thereon, a passivation film covering at least the integrated circuit, an adhesive layer disposed on the passivation film, a support member fixed to the insulative material through the adhesive layer to support the monosilicon layer, an insulative film transformed from a given region of the monosilicon layer, a semiconductive layer comprising one of a polysilicon layer and an amorphous silicon layer formed on the insulative film and having a switching element group for switching pixels of an active matrix display, and a driver integrated circuit formed in the remaining region of the monosilicon layer for driving the switching element group.

22. A semiconductor device, comprising: an electrically insulative material, a monosilicon layer disposed on the insulative material and having at least an integrated circuit formed thereon, a passivation film covering at least the integrated circuit, an adhesive layer disposed on the passivation film, and a support member fixed to the insulative material through the adhesive layer to support the monosilicon layer, the monosilicon layer being formed with a switching element group for switching pixels of an active matrix display and a driver integrated circuit for driving the switching element group, the switching element group and the driver integrated circuit comprising MIS transistors of electric field effect type having a metal/insulator/semiconductor structure, and wherein the MIS transistor of the switching element group has a certain product value of length and width which is smaller than that of the MIS transistor contained in the driver integrated circuit.

23. A semiconductor device, comprising: an electrically insulative material, a monosilicon layer disposed on the insulative material and having at least an integrated circuit formed thereon, a passivation film covering at least the integrated circuit, an adhesive layer disposed on the passivation film, and a support member fixed to the insulative material through the adhesive layer to support the monosilicon layer, the integrated circuit formed in the monosilicon layer containing an MIS transistor of an electric field effect type having a metal/insulator/semiconductor structure, the MIS transistor comprising a single crystal semiconductor substrate composed of a region of the monosilicon layer containing an impurity of a first electroconductivity type, a pair of source and drain regions formed in the single crystal semiconductor substrate and containing another impurity of a second electroconductivity type, a channel region formed on a surface of the single crystal semiconductor substrate between the source and the drain regions, and a gate electrode disposed on the channel region through a gate insulating film, and a part of the single crystal semiconductor substrate positioned between the gate insulating film and the insulative material comprising an impurity layer of one electroconductivity type having a relatively thin density in the channel region as compared to a lower region in the vicinity of a boundary to the electrically insulative material.

24. A semiconductor device, comprising: an electrically insulative material, a monosilicon layer disposed on the insulative material and having at least an integrated circuit formed thereon, a passivation film covering at least the integrated circuit, an adhesive layer disposed on the passivation film, and a support member fixed to the insulative material through the adhesive layer to support the monosilicon layer, wherein the integrated circuit formed in the monosilicon layer comprises a pair of an N type MIS transistor and a P type MIS transistor, a thickness of the monosilicon layer of the N type MIS transistor being thicker than that of the monosilicon layer of the P type MIS transistor.

25. A semiconductor device, comprising: an electrically insulative material, a monosilicon layer disposed on the insulative material and having at least an integrated circuit formed thereon, a passivation film covering at least the integrated circuit, an adhesive layer disposed on the passivation film, and a support member fixed to the insulative material through the adhesive layer to support the monosilicon layer, wherein the monosilicon layer is formed with a switching element group for switching pixels of an active matrix display and a driver integrated circuit for driving the switching element group, the switching element group and the driver integrated circuit comprising MIS transistors of an electric field effect type having a metal/insulator/semiconductor structure, and a thickness of a region of the monosilicon layer where the driver integrated circuit is formed being thicker than that of a region of the monosilicon layer where the switching element group is formed.

26. A semiconductor device, comprising: an electrically insulative material, a monosilicon layer disposed on the insulative material and having at least an integrated circuit formed thereon, a passivation film covering at least the integrated circuit, an adhesive layer disposed on the passivation film, a support member fixed to the insulative material through the adhesive layer to support the monosilicon layer, a pixel switching element group for an active matrix display formed in one of a region of the monosilicon layer and a region composed of one of a polysilicon layer and an amorphous silicon layer disposed on an insulating film composed of silicon oxide which is transformed from the monosilicon layer by oxidation, and a driver integrated circuit formed in another region of the monosilicon layer for driving the pixel switching element group, wherein a thickness of a part of the insulative material on which the pixel switching element group is disposed is thinner than that of a part of the insulative material on which the driver integrated circuit is disposed.

* * * * *